United States Patent
Isobe

(10) Patent No.: US 8,178,412 B2
(45) Date of Patent: May 15, 2012

(54) SEMICONDUCTOR MEMORY DEVICE AND METHOD OF MANUFACTURING THE SAME

(75) Inventor: Kazuaki Isobe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 541 days.

(21) Appl. No.: 12/237,045

(22) Filed: Sep. 24, 2008

(65) Prior Publication Data

US 2009/0090963 A1   Apr. 9, 2009

(30) Foreign Application Priority Data

Sep. 25, 2007   (JP) .................................. 2007-248021

(51) Int. Cl.
 *H01L 21/336* (2006.01)
 *H01L 29/792* (2006.01)

(52) U.S. Cl. ........ 438/287; 438/201; 438/211; 438/216; 438/231; 438/241; 438/257; 438/258; 438/260; 438/266; 438/529; 438/591; 438/593

(58) Field of Classification Search .................. 438/231, 438/529, 201, 211, 216, 241, 257, 258, 260–266, 438/287, 593; 257/326
See application file for complete search history.

(56) References Cited

U.S. PATENT DOCUMENTS

| | | | |
|---|---|---|---|
| 6,207,991 B1 * | 3/2001 | Rahim ........................... | 257/326 |
| 6,359,303 B1 | 3/2002 | Kanamori | |
| 6,953,963 B2 * | 10/2005 | Wang et al. .................... | 257/315 |
| 7,166,887 B2 | 1/2007 | Park et al. | |
| 7,274,075 B2 * | 9/2007 | Yaegashi ........................ | 257/391 |
| 7,291,882 B2 * | 11/2007 | Yang et al. .................... | 257/321 |
| 7,342,828 B2 | 3/2008 | Ishii et al. | |
| 7,387,933 B2 | 6/2008 | Park et al. | |
| 2003/0096484 A1 * | 5/2003 | Lee et al. ....................... | 438/305 |
| 2005/0001260 A1 | 1/2005 | Park et al. | |
| 2006/0199334 A1 | 9/2006 | Park et al. | |
| 2007/0097746 A1 | 5/2007 | Isobe et al. | |
| 2007/0252188 A1 | 11/2007 | Isobe | |
| 2008/0012062 A1 * | 1/2008 | Yoo et al. ....................... | 257/316 |
| 2008/0106948 A1 | 5/2008 | Ueda et al. | |
| 2009/0263946 A1 * | 10/2009 | Benaissa et al. .............. | 438/231 |

FOREIGN PATENT DOCUMENTS

| | | |
|---|---|---|
| JP | 11-214547 A | 8/1999 |
| JP | 2000-114404 A | 4/2000 |
| JP | 2002-231832 A | 8/2002 |
| JP | 2005-026696 A | 1/2005 |
| JP | 2006-309890 A | 11/2006 |
| JP | 2006-332130 A | 12/2006 |
| JP | 2008-118040 A | 5/2008 |

* cited by examiner

*Primary Examiner* — Jerome Jackson, Jr.
*Assistant Examiner* — David Spalla
(74) *Attorney, Agent, or Firm* — Foley & Lardner LLP

(57) ABSTRACT

A plurality of memory cells each constituted of a memory cell transistor having a gate electrode in a laminated structure composed of a charge storage layer and a control gate layer and a select transistor having source/drain diffusion layers while one of the source/drain diffusion layers is shared by the memory cell transistor are arranged in and on a semiconductor substrate. The impurity concentration of the source/drain diffusion layer shared by the memory cell transistor and the select transistor in each of the plurality of memory cells is set lower than the impurity concentration of the other source/drain diffusion layers in each of the memory cells.

13 Claims, 20 Drawing Sheets

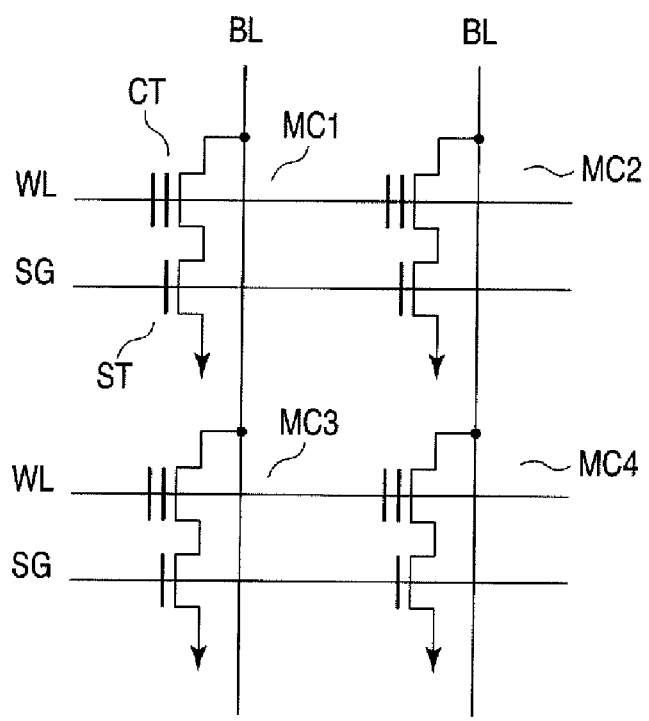
F I G. 1
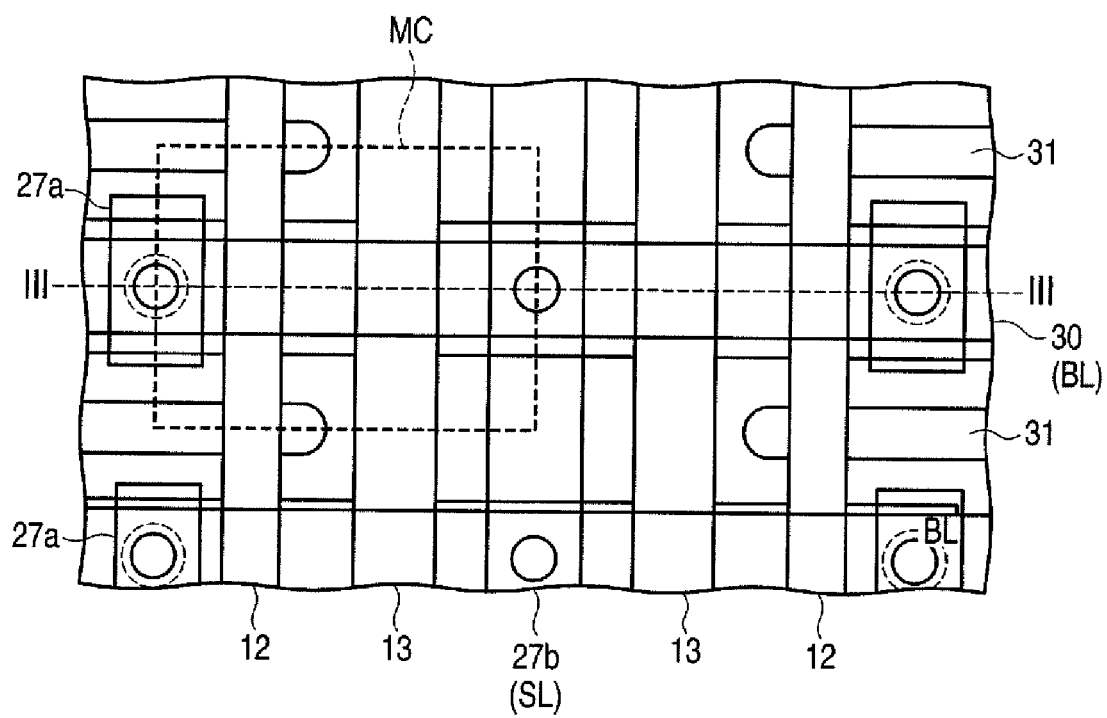
F I G. 2

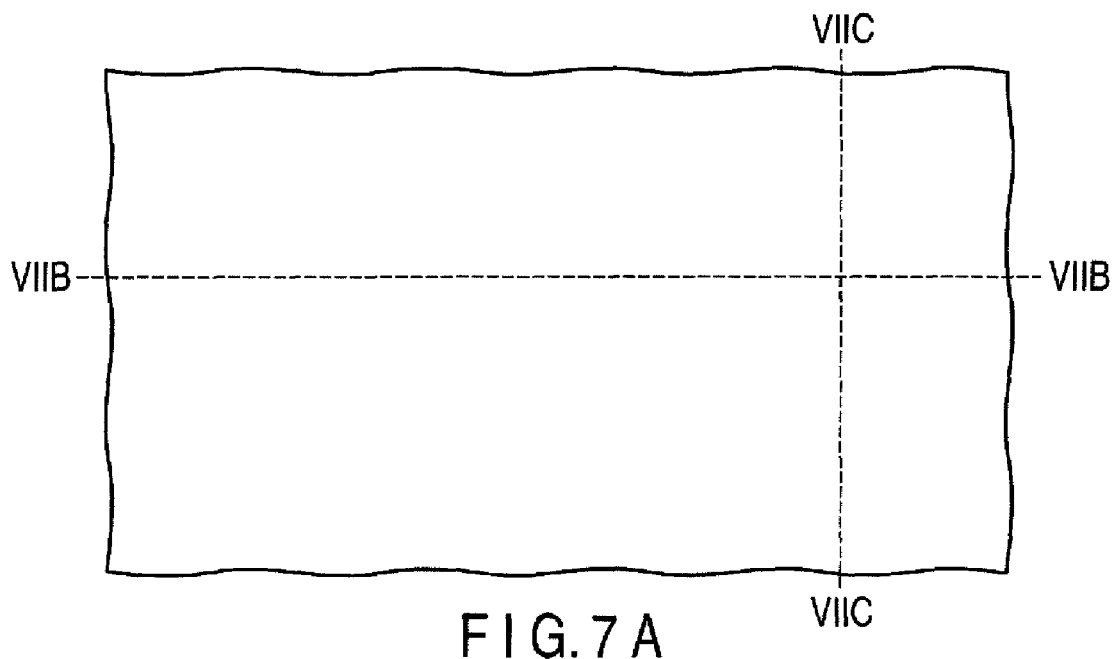
F I G. 7 A
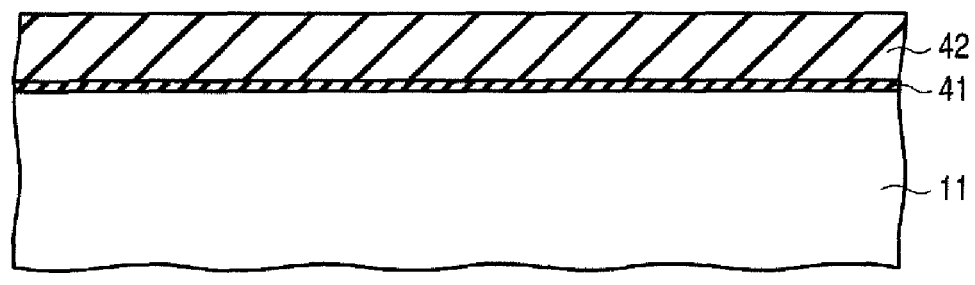
F I G. 7 B
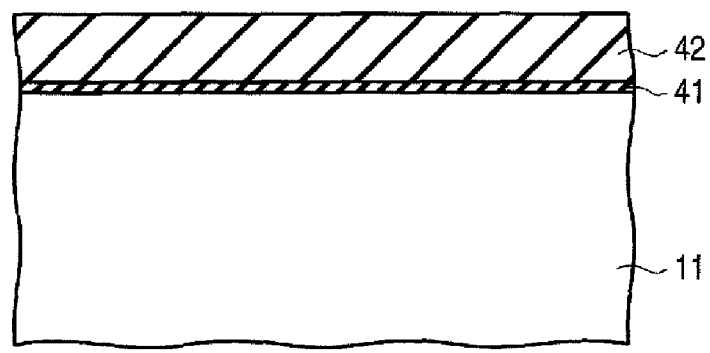
F I G. 7 C

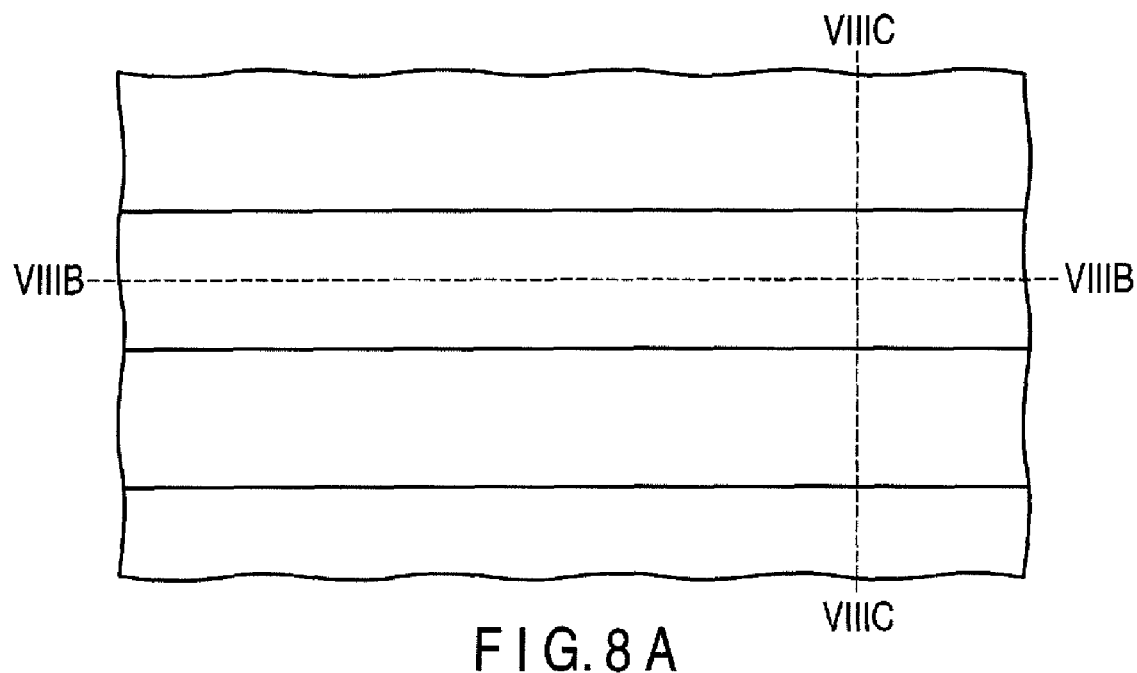
F I G. 8 A
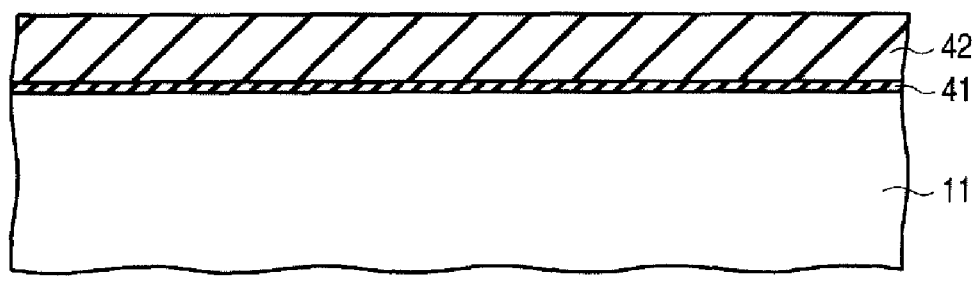
F I G. 8 B
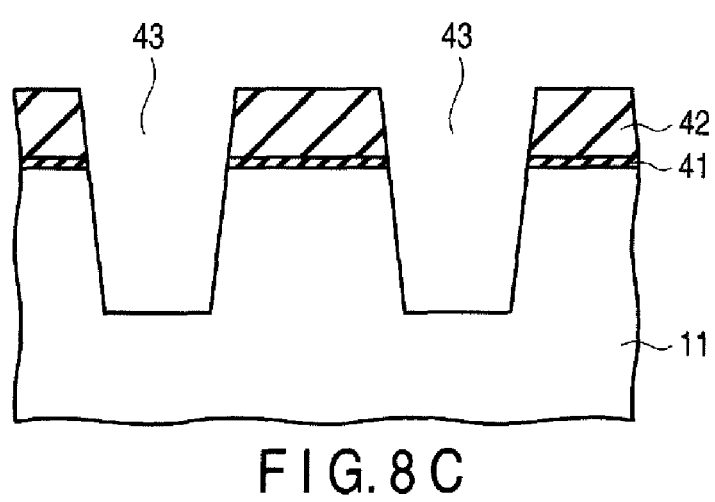
F I G. 8 C

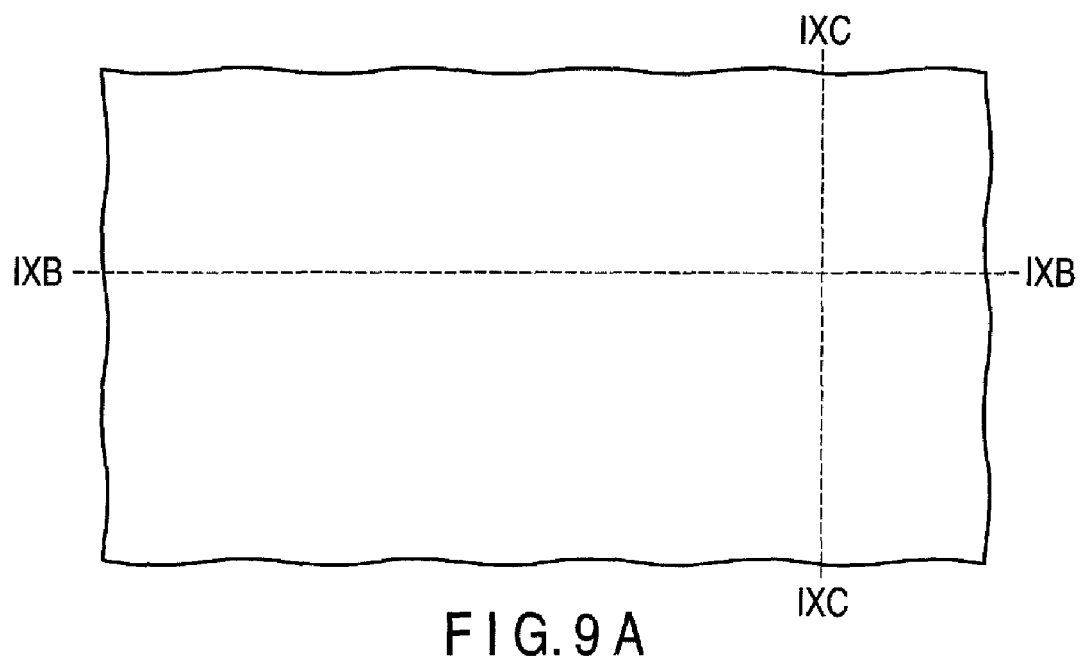
F I G. 9 A
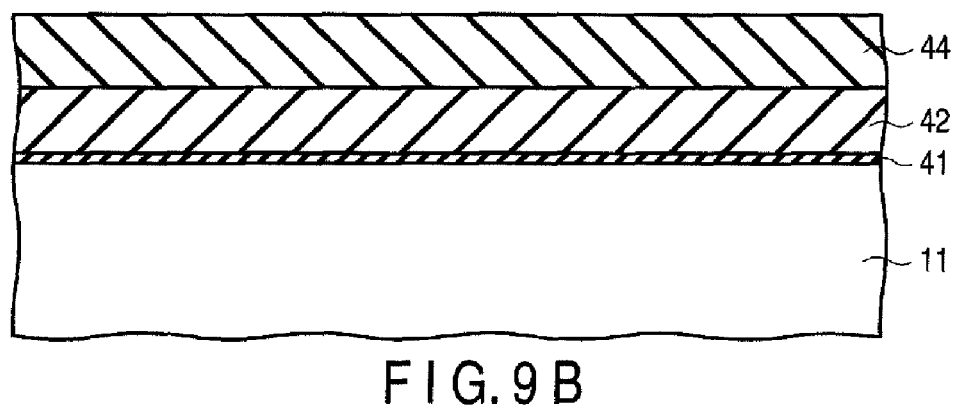
F I G. 9 B
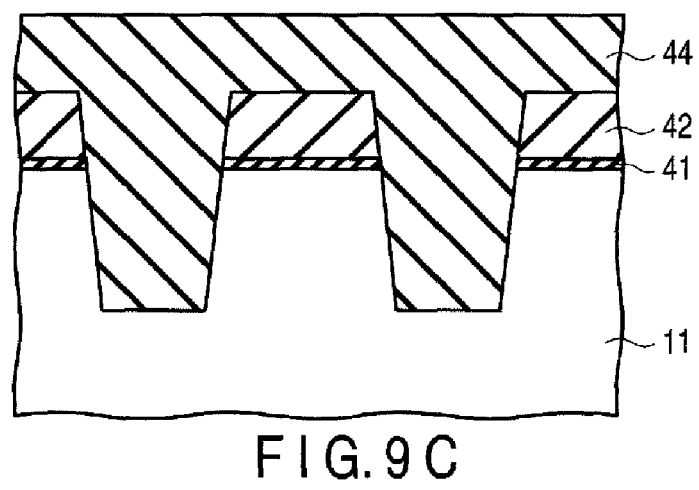
F I G. 9 C

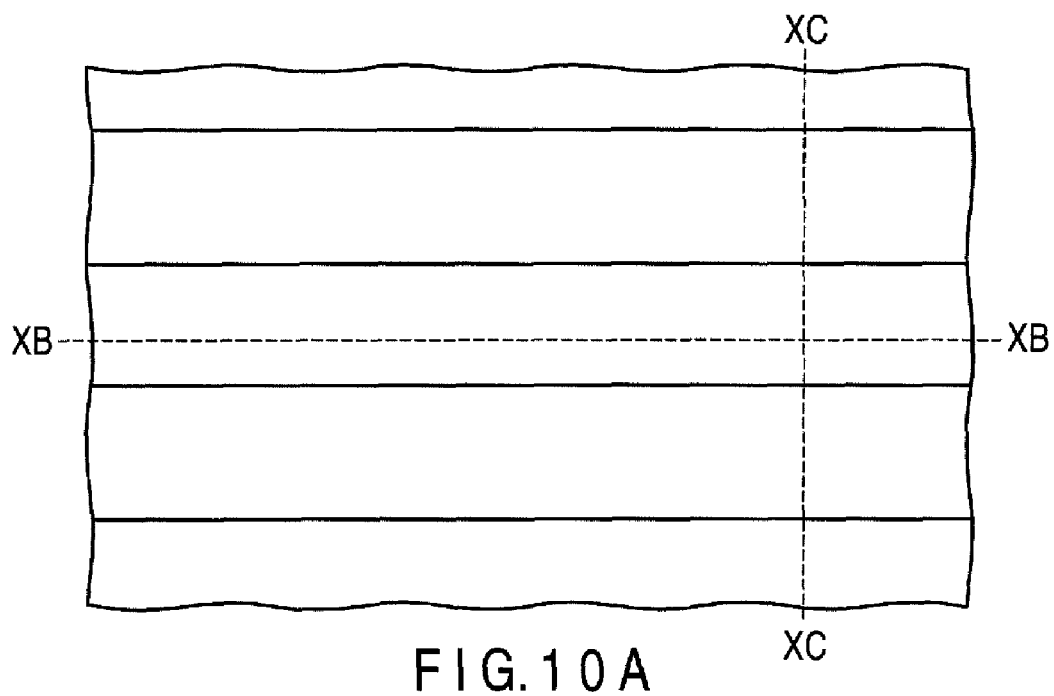
F I G. 1 0 A
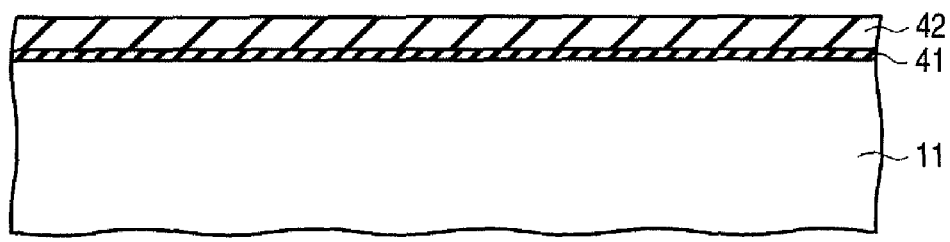
F I G. 1 0 B
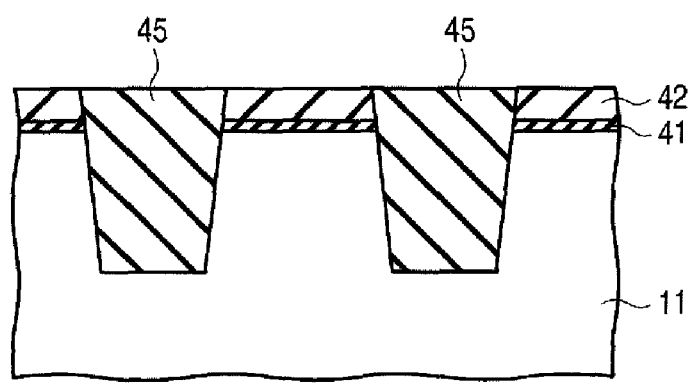
F I G. 1 0 C

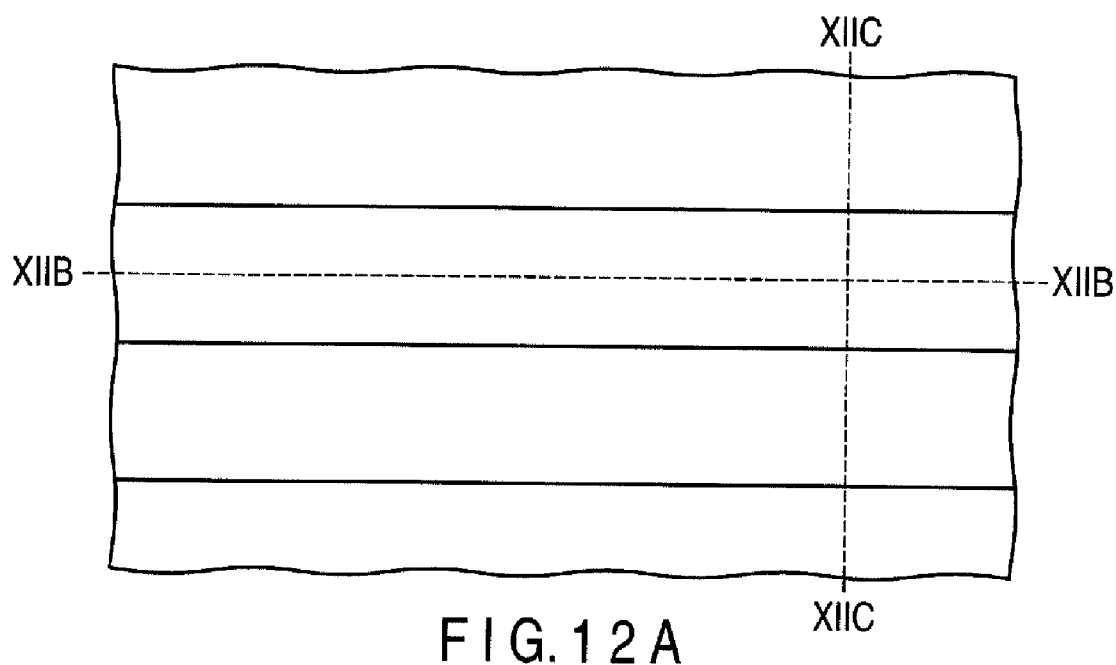
F I G. 1 2 A
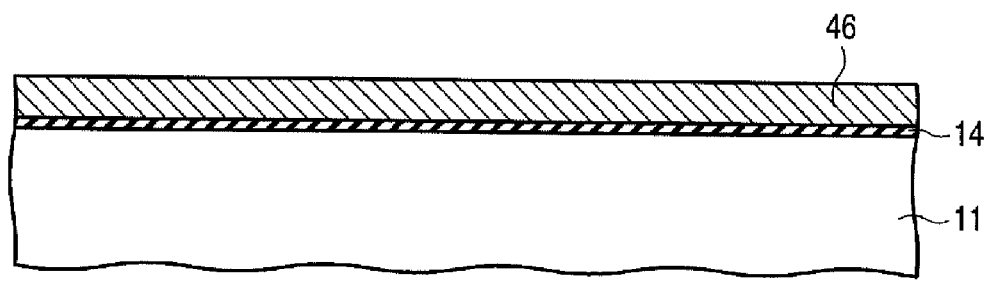
F I G. 1 2 B
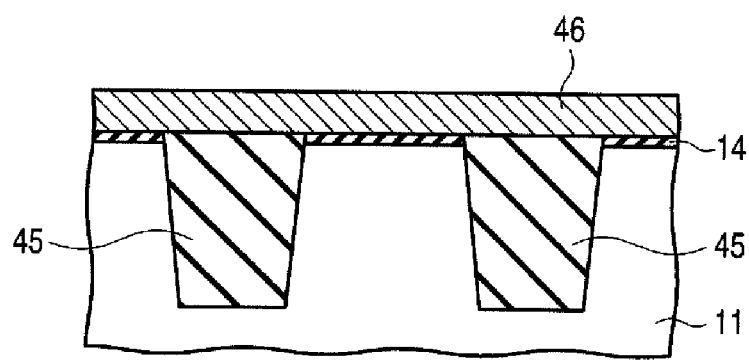
F I G. 1 2 C

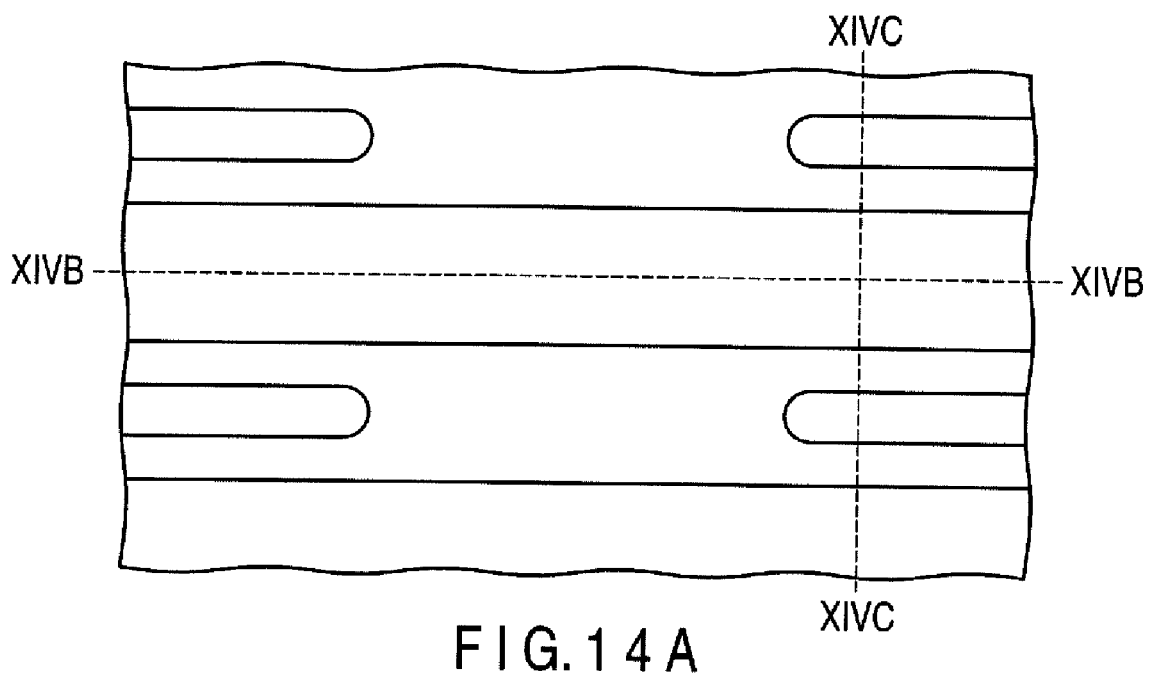
F I G. 1 4 A
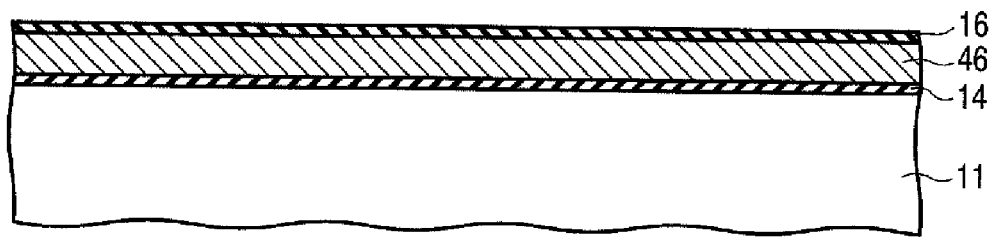
F I G. 1 4 B
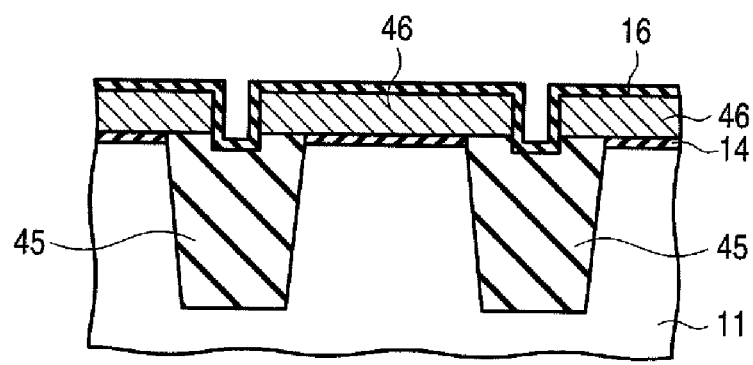
F I G. 1 4 C

SEMICONDUCTOR MEMORY DEVICE AND METHOD OF MANUFACTURING THE SAME

CROSS-REFERENCE TO RELATED APPLICATIONS

This application is based upon and claims the benefit of priority from prior Japanese Patent Application No. 2007-248021, filed Sep. 25, 2007, the entire contents of which are incorporated herein by reference.

BACKGROUND OF THE INVENTION

1. Field of the Invention

The present invention relates to a semiconductor memory device such as a nonvolatile memory represented by a flash EEPROM in which its memory cell is constituted of a nonvolatile memory cell transistor and a select transistor and a nonvolatile memory embedded logic integrated circuit, and a method of manufacturing the semiconductor memory device.

2. Description of the Related Art

There has been known a nonvolatile memory which is constituted of the nonvolatile memory cell transistor having a stacked gate structure containing a charge storage layer and a control gate layer and the select transistor for selecting a specific memory cell transistor at the time of program, read or erase for the memory cell transistor. In this nonvolatile memory, a drain diffusion layer of a memory cell transistor is connected to a bit line and a source diffusion layer of a select transistor is connected to a source line so as to share the source diffusion layer of the memory cell transistor and the drain diffusion layer of the select transistor. That is, each memory cell has a structure in which the memory cell transistor and the select transistor are connected in series between the bit line and the source line.

The source diffusion layer and drain diffusion layer of the memory cell transistor and the select transistor are formed by introducing impurity into a device region on a semiconductor substrate. To ensure a sufficiently large memory cell current, resistance values of the source and drain diffusion layers need to be reduced by increasing the impurity concentration of the source and drain diffusion layers. However, if the impurity concentrations of the source and drain diffusion layers shared by the memory cell transistor and the select transistor are increased, a leakage current larger than a capacity of supply from a charge pump circuit is generated by a gate induced drain leakage (GIDL), so that no desired potential can be supplied to the nonvolatile memory.

In the meantime, Jpn. Pat. Appln. KOKAI Publication No. 2006-309890 has disclosed a nonvolatile semiconductor memory device in which the select transistor is connected in series to the memory cell transistor while the select transistor has a two-layer gate structure and, by driving the voltages of each gates of the select transistor individually, the absolute value of a generated voltage level of the gate voltage generating portion for the select transistor is decreased to reduce consumption current.

Further, Jpn. Pat. Appln. KOKAI Publication No. 11-214547 has disclosed a nonvolatile semiconductor memory device in which the source diffusion layer is constituted of a high concentration source diffusion layer and a first low concentration source diffusion layer which is located adjacent to the side portion on the floating gate side of the high concentration source diffusion layer and has a lower impurity concentration than the high concentration source diffusion layer, and the first low concentration source diffusion layer has a shallower coupling than the high concentration source diffusion layer so as to suppress an increase in leakage current.

Jpn. Pat. Appln. KOKAI Publication No. 2000-114404 has disclosed a flash memory in which, of a channel region under the floating gate, a channel region adjacent to the impurity diffusion layer on the drain side has a p+ region where the concentration of p-type impurity is the highest in the channel region and a p+ region provided at a portion not covered by the floating gate in the channel region.

Further, Jpn. Pat. Appln. KOKAI Publication No. 2002-231832 has disclosed a nonvolatile semiconductor memory device which includes a memory cell unit containing a memory cell transistor having a stacked gate structure composed of a floating gate and a control gate, and a select gate transistor in which one of the source/drain diffusion layers is connected to a bit line or a source line while the other is connected to the memory cell unit, wherein the shape of the source/drain diffusion layers of the select gate transistor is asymmetrical under a gate electrode of the selective gate transistor.

BRIEF SUMMARY OF THE INVENTION

According to a first aspect of the present invention, there is provided a semiconductor memory device comprising: a plurality of memory cells arranged in and on a semiconductor substrate, each of the plurality of memory cells including: a memory cell transistor having a gate electrode in a laminated structure composed of a charge storage layer and a control gate layer and source/drain diffusion layers; and a select transistor having source/drain diffusion layers while one of the source/drain diffusion layers is shared by one of the source/drain diffusion layers of the memory cell transistor, wherein an impurity concentration of the source/drain diffusion layer shared by the memory cell transistor and the select transistor within each of the plurality of memory cells is set lower than an impurity concentration of the other source/drain diffusion layers within each memory cell.

According to a second aspect of the present invention, there is provided a method of manufacturing a semiconductor memory device, comprising: forming a plurality of arrays each constituted of a gate electrode of a memory cell transistor having a laminated structure composed of a charge storage layer and a control gate layer and a gate electrode of a select transistor in and on a semiconductor substrate of a first conductivity type with the gate electrode of the memory cell transistor and the gate electrode of the select transistor used as a mask; introducing an impurity of a second conductivity type in a tilted direction with respect to the surface region of the semiconductor substrate and in a direction parallel to a gate length direction of the memory cell transistor and the select transistor; after the semiconductor substrate is rotated by a desired angle horizontally, repeating introduction of the impurity of the second conductivity type in the tilted direction with respect to the surface region of the semiconductor substrate and in a direction perpendicular to the gate length direction of the memory cell transistor and the select transistor with the gate electrode of the memory cell transistor and the gate electrode of the select transistor used as a mask; and annealing to form source/drain diffusion layers of the memory cell transistor and the select transistor that an impurity concentration between the gate electrode of the memory cell transistor and the gate electrode of the select transistor is lower than an impurity concentration between the gate electrodes of the memory cell transistors and an impurity concentration between the gate electrodes of the select transistors.

According to a third aspect of the present invention, there is provided a method of manufacturing a semiconductor memory device, comprising: forming a plurality of arrays each constituted of a gate electrode of a memory cell transistor having a laminated structure composed of a charge storage layer and a control gate layer and a gate electrode of a select transistor in and on a semiconductor substrate of a first conductivity type; introducing an impurity of a second conductivity type in a tilted direction with respect to the surface region of the semiconductor substrate and in a direction parallel to a gate length direction of the memory cell transistor and the select transistor with the gate electrode of the memory cell transistor and the gate electrode of the select transistor used as a mask; after the semiconductor substrate is rotated by a desired angle horizontally, introducing the impurity of the second conductivity type in a tilted direction with respect to the surface region of the semiconductor substrate and in a direction parallel to the gate length direction of the memory cell transistor and the select transistor; introducing the impurity of the second conductivity type in a vertical direction with respect to the surface region of the semiconductor substrate with the gate electrode of the memory cell transistor and the gate electrode of the select transistor used as a mask; and annealing to form the source/drain diffusion layers of the memory cell transistor and the select transistor that an impurity concentration between the gate electrode of the memory cell transistor and the gate electrode of the select transistor is lower than an impurity concentration between the gate electrodes of different memory cell transistors and an impurity concentration between the gate electrodes of different select transistors.

BRIEF DESCRIPTION OF THE SEVERAL VIEWS OF THE DRAWING

FIG. 1 is an equivalent circuit diagram of the memory cell array of a flash EEPROM according to an embodiment of the present invention;

FIG. 2 is a plan view in the case where the memory cell arrays of FIG. 1 are integrated on a semiconductor substrate;

FIG. 7A is a plan view showing an initial process for manufacturing a flash EEPROM according to the embodiment of the present invention and FIGS. 7B and 7C are sectional views thereof;

FIGS. 8A to 8C are a plan view and sectional views showing a process subsequent to FIGS. 7A to 7C;

FIGS. 9A to 9C are a plan view and sectional views showing a process subsequent to FIGS. 8A to 8C;

FIGS. 10A to 10C are a plan view and sectional views showing a process subsequent to FIGS. 9A to 9C;

FIGS. 12A to 12C are a plan view and sectional views showing a process subsequent to FIGS. 11A to 11C;

FIGS. 14A to 14C are a plan view and sectional views showing a process subsequent to FIGS. 13A to 13C;

DETAILED DESCRIPTION OF THE INVENTION

Figure 3:
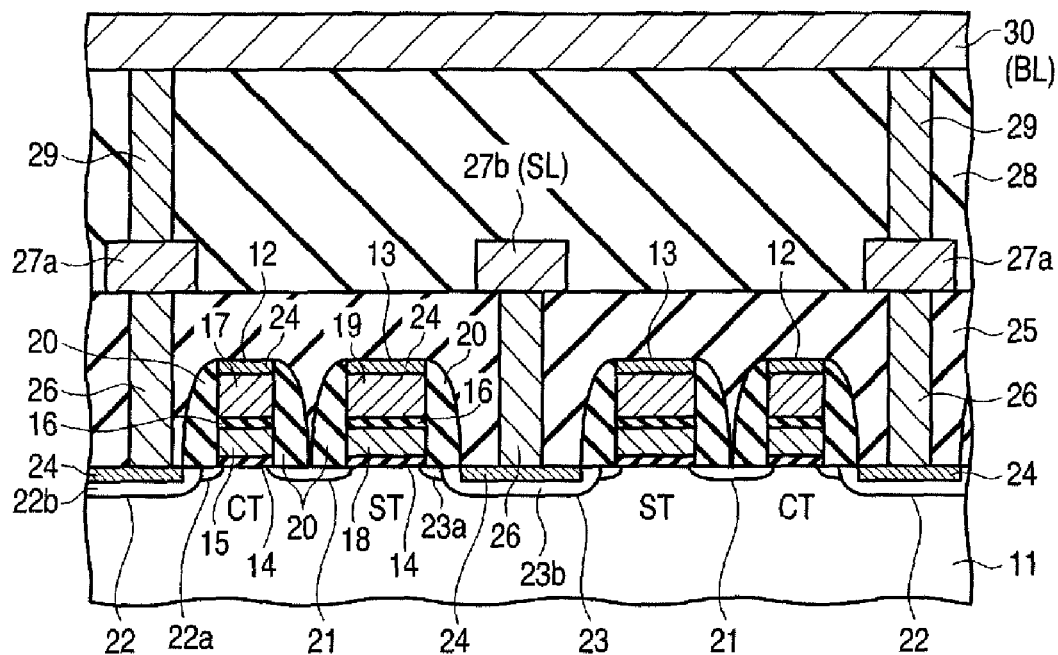
FIG. 3 is a sectional view of a device structure taken along the line III-III in FIG. 2.

Hereinafter, embodiments of the present invention will be described with reference to the accompanying drawings. In this description, like reference numerals are attached to like components in all the drawings.

FIG. 1 is an equivalent circuit diagram of a memory cell array of a flash EEPROM according to an embodiment of the present invention. As shown in the Figure, a plurality of nonvolatile memory cells MC is arranged in a matrix fashion. In this example, only four memory cells MC1 to MC4 are shown for convenience. However, actually, more nonvolatile memory cells are provided within a memory cell array. Each memory cells MC are connected in parallel between the bit line BL and a common source node (common source line). Each memory cell MC is constituted of a memory cell transistor CT composed of a nonvolatile transistor and a select transistor ST which is connected in series to the memory cell transistor CT. In the plurality of memory cells MC disposed on the same row, the gate electrode (control gate layer) of the memory cell transistor CT is connected to a word line WL in common and the gate electrode of the select transistor ST is connected to a select gate line SG in common.

FIG. 2 is a plan view of a case where the memory cell arrays shown in FIG. 1 are integrated in and on a semiconductor substrate and FIG. 3 is a sectional view thereof. In FIGS. 2 and 3, a p-type well 11 is formed on a silicon (Si) semiconductor substrate. A plurality of rows of each of the gate electrodes 12 of the memory cell transistors CT and the gate electrodes 13 of the select transistors ST are formed in and on the p-type well 11. The gate electrode 12 of the memory cell transistor CT has a charge storage layer 15 composed of, for example, polysilicon formed on the p-type well 11 via a silicon oxide film 14 which serves as a tunnel oxide film and a control gate layer 17 composed of, for example, polysilicon formed on the charge storage layer 15 via an inter-gate insulation film 16 such as ONO film (silicon oxide film, silicon nitride film, laminated film of silicon oxide films). The gate electrode 13 of the select transistor ST has a first gate layer 18 composed of, for example, polysilicon formed on the p-type well 11 via the silicon oxide film 14 and a second gate layer 19 composed of, for example, polysilicon formed on the first gate layer 18 via the inter-gate insulation film 16. The charge storage layer 15 of the memory cell transistor CT and the first gate layer 18 of the select transistor ST are formed of the polysilicon film of the first layer. Further, the control gate layer 17 of the memory cell transistor CT and the second gate layer 19 of the select transistor ST are formed of the polysilicon film of the second layer. The first gate layer 18 of the select transistor ST and the second gate layer 19 are connected mutually in the periphery of the memory cell array. A side wall spacer 20 composed of silicon oxide film is formed on the side wall of the gate electrode 12 of the memory cell transistor CT and the gate electrode 13 of the select transistor ST.

An n-type source/drain diffusion layer 21 shared by the memory cell transistor CT and the select transistor ST is formed in a surface region of the p-type well 11 between the gate electrode 12 of the memory cell transistor CT and the gate electrode 13 of the select transistor ST. An n-type source/drain diffusion layer 22 of the memory cell transistor CT is formed in the surface region of the p-type well 11 between the gate electrodes 12 of the memory cell transistors CT of different memory cells. Further, an n-type source/drain diffusion layer 23 of the select transistor ST is formed in the surface region of the p-type well 11 between the gate electrodes 13 of the select transistors ST of different memory cells.

For example, arsenic (As) is introduced into the source/drain diffusion layer 21 as n-type impurity and the impurity concentration of arsenic (As) is set in a range of $1E18 \text{ cm}^{-3}$ to $1E19 \text{ cm}^{-3}$, preferably, to $5E18 \text{ cm}^{-3}$. The source/drain diffusion layers 22 and 23 are composed of n-type first layers 22a and 23a and n+ type second layers 22b and 23b. For example, arsenic (As) is introduced into the first layers 22a and 23a as n-type impurity and the impurity concentration of arsenic (As) is set to $2E19 \text{ cm}^{-3}$. For example, arsenic (As) is introduced into the second layers 22b and 23b as n-type impurity and the impurity concentration of arsenic (As) is set to $2E19 \text{ cm}^{-3}$ or more so as to have a deeper junction than the first layers 22a and 23a. In the meantime, the second layers 22b and 23b function as a contact region for making contact with the first layers 22a and 23a. For example, a metal silicide 24 composed of, for example, $CoSi_2$ is formed on the surfaces of the second layers 22b, 23b of the source/drain diffusion layers 22 and 23 and the surface of the gate electrodes 12, 13.

A first interlayer insulation film 25 composed of boron doped phosphor-silicate glass (BPSG) or phosphor-silicate glass (PSG) is deposited on the gate electrodes 12 and 13. The first interlayer insulation film 25 contains contact holes communicating with the surface of the source/drain diffusion layers 22 and 23. For example, tungsten (W) is buried in this contact hole so as to form a contact plug 26. Wirings 27a, 27b composed of for example, aluminum (Al) are formed on the contact plug 26. The wiring 27a is formed in an island shape so as to connect the contact plug 26 to a via hole described later. As shown in FIG. 2, the other wiring 27b is formed to extend over plural memory cells, thereby constituting a common source line SL.

A second interlayer insulation film 28 composed of BPSG or PSG is deposited on the first interlayer insulation film 25. The via hole communicating with the surface of the wiring 27a is made in the second interlayer insulation film 28 and for example, tungsten (W) is buried in this via hole so as to form the via hole 29. A wiring 30 composed of, for example, aluminum (Al) is formed on the second interlayer insulation film 28 and each via hole 29 is connected to this wiring 30 commonly. The wiring 30 is extended in a direction perpendicular to the wiring 27b (SL) as shown in FIG. 2 thereby constituting a bit line BL.

An area surrounded by a dotted line in FIG. 2 indicates a formation area of a single memory cell MC. Further, polysilicon constituting the charge storage layer 15 of the memory cell transistor CT is separated in each memory cell transistor CT by a plurality of slits 31.

The flash EEPROM shown in FIGS. 2 and 3 has a plurality of memory cells MC composed of the memory cell transistor CT which is constituted of a nonvolatile transistor containing the gate electrodes 12 having a laminated structure composed of the charge storage layer 15 and the control gate layer 17 and the select transistor ST which is connected to the memory cell transistor CT in series and shares the source/drain diffusion layer 21 with the memory cell transistor CT, the memory cells MC being disposed on a semiconductor substrate. In each of the plural memory cells MC, the impurity concentration of the source/drain diffusion layer 21 shared by the memory cell transistor CT and the select transistor ST is set lower than the impurity concentration of the other source/drain diffusion layers 22, 23 (first layers 22a and 23a) of each memory cell MC.

Figure 4:
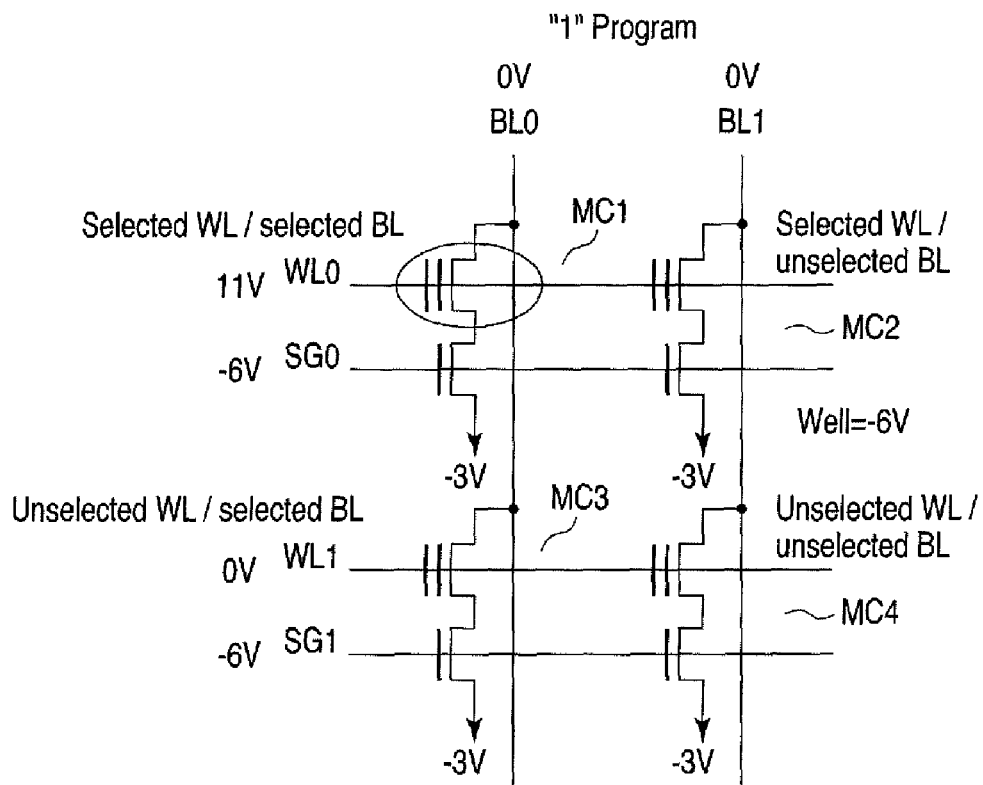
FIG. 4 is a diagram showing an example of voltages supplied to each portion when a memory cell is selected from the memory cell array of FIG. 1 to program "1" data.
Figure 5:
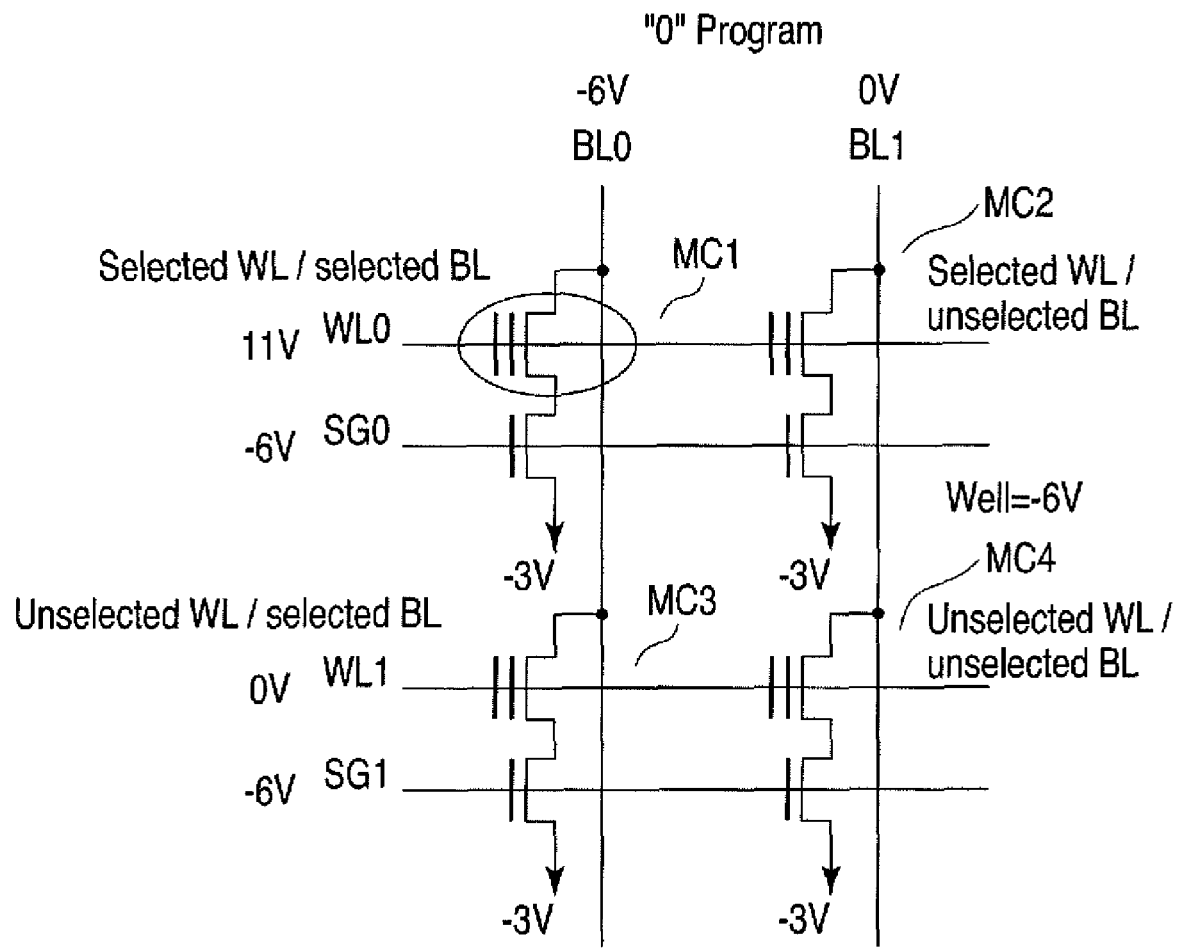
FIG. 5 is a diagram showing an example of voltages supplied to each portion when a memory cell is selected from the memory cell array of FIG. 1 to program "0" data.

Next, consider an operation of programming data in the flash EEPROM having the above-described structure. FIG. 4 shows an example of voltages supplied to each portion when one memory cell MC1 is selected from four memory cells MC1 to MC4 within the memory cell array shown in FIG. 1 so as to program "1" data ("1" program). Likewise, FIG. 5 shows an example of voltages supplied to each portion when one memory cell MC1 is selected from the four memory cells MC1 to MC4 within the memory cell array shown in FIG. 1 so as to program "0" data ("0" program). In FIGS. 4 and 5, the memory cell transistor CT of a selected memory cell MC1 is surrounded with a circle.

In case of "1" program, the voltages of all bit lines including a bit line BL (BL0) to which the selected memory cell MC1 is connected are set to 0 V, the voltage of the word line WL (WL0) to which the selected memory cell MC1 is connected is set to 11 V, the voltage of the other word lines WL (WL1) is set to 0 V, the voltage of all the select gate lines SG (SG0, SG1) is set to −6 V, the voltage of common source lines is set to −3 V and the voltage of the p-type well (Well) in which a memory cell is formed is set to −6 V.

In case of "0" program, the voltage of the bit line BL (BL0) to which the selected memory cell MC1 is connected is set to −6 V, the voltage of the other bit lines BL (BL1) is set to 0 V, the voltage of the word line WL (WL0) to which the selected memory cell MC1 is connected is set to 11 V, the voltage of the other word lines WL (WL1) is set to 0 V, the voltage of all select gate lines SG (SG0, SG1) is set to −6 V, the voltage of common source lines is set to −3 V and the voltage of the p-type well (Well) in which the memory cell is formed is set to −6 V.

As shown in FIG. 4, if attention is paid to a memory cell MC3 in which the WL is not selected and the BL is selected, although the select transistor ST is off, the memory cell transistor CT is on. As a result, 0 V of the bit line BL0 is applied to the source/drain diffusion layer shared by the memory cell transistor CT and the select transistor ST. If the impurity concentration of this shared source/drain diffusion layer is set high, the GIDL is generated between the source/drain diffusion layer and the p-type well. A number of memory cells in which the WL is not selected and the BL is selected like the memory cell MC3 exist on an actual flash EEPROM. Consequently, the leakage current due to the GIDL of the entire memory becomes large. Usually, a negative voltage of −6 V or the like is generated by a boosting circuit using a charge pump circuit. Thus, the voltage of −6 V supplied to the p-type well is reduced (the absolute value drops). If this voltage drops, a potential difference between the gate electrode of the memory cell in which transistor CT in the selected memory cell the "0" program is executed and the p-type well drops, thereby generating "0" program failure, that is, a programming error.

However, in this embodiment, since the impurity concentration (in a range of 1E18 cm$^{-3}$ to 1E19 cm$^{-3}$, preferably, 5E18 cm$^{-3}$) of the source/drain diffusion layer 21 shared by the memory cell transistor CT and the select transistor ST is set lower than the impurity concentration (2E19 cm$^{-3}$) of the source/drain diffusion layers 22, 23 (first layers 22a and 23a) other than each memory cells MC, generation of the GIDL is suppressed thereby preventing generation of the programming error.

Figure 6A:
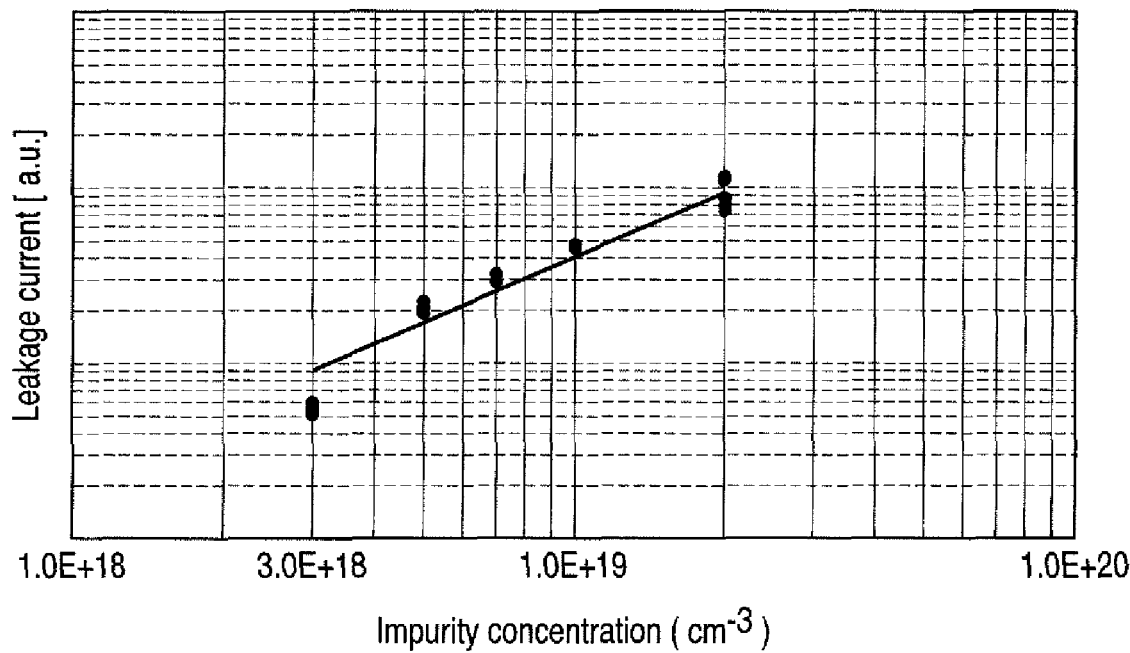
FIG. 6A is a characteristic diagram showing an example of the relationship between the impurity concentration of the source/drain diffusion layer of the memory cell and a leakage current due to the GIDL and FIG. 6B is a characteristic diagram showing an example of the relationship between a dose amount for forming the source/drain diffusion layer of the memory cell and a leakage current due to the GIDL.
Figure 6B:
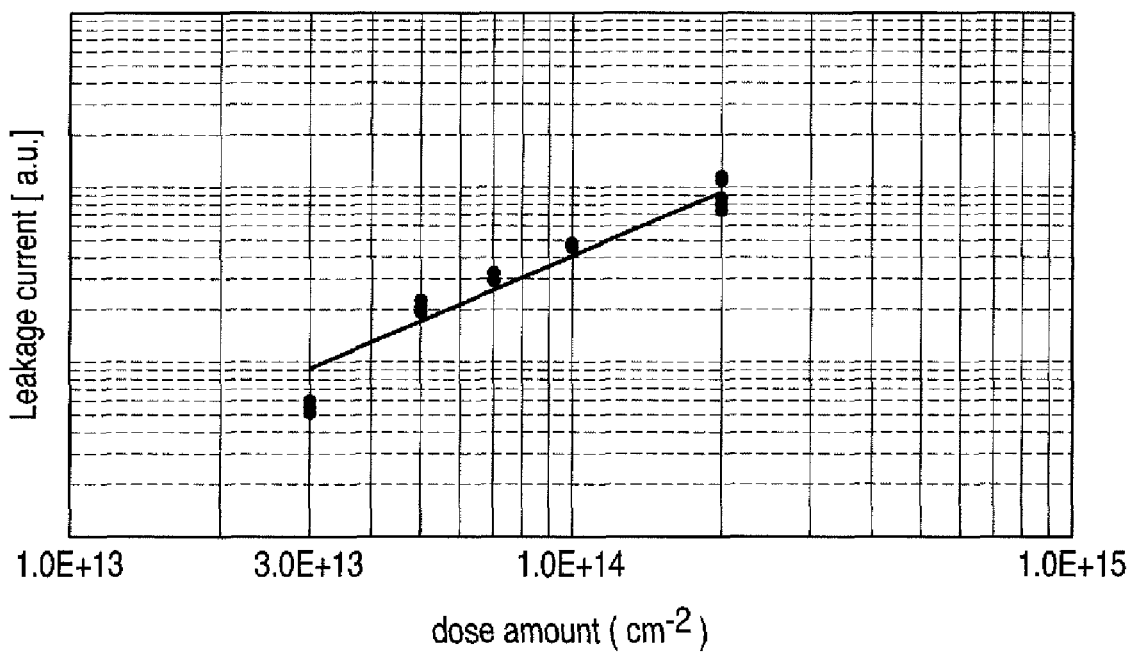

FIG. 6A is a characteristic diagram showing an example of the relation between the impurity concentration of the source/drain diffusion layer 21 and the leakage current (a.u) due to the GIDL generated between the source/drain diffusion layer 21 and the p-type well. FIG. 6B is a characteristic diagram showing an example of the relation between the dose amount of the impurity implanted when the source/drain diffusion layer 21 is formed and the leakage current (a.u) due to the GIDL generated between the source/drain diffusion layer 21 and the p-type well. When the impurity concentration of the source/drain diffusion layer 21 is set to 5E18 cm$^{-3}$ (dose amount of 5E13 cm$^{-2}$), the value of the leakage current is kept low.

(First Embodiment of Manufacturing Method)

Next, the method for manufacturing the flash EEPROM containing the memory cell array having a structure shown in FIGS. 2 and 3 will be described with reference to FIGS. 7A to 7C to FIGS. 21A to 21C. In the meantime, of the respective figures, A indicates a plan view and B and C indicate sectional views.

As shown in FIGS. 7A to 7C, a silicon oxide film 41 and a silicon nitride film 42 are deposited successively on the surface of the p-type well 11 of the silicon semiconductor substrate. Next, as shown in FIGS. 8A to 8C, a photoresist film having a desired pattern is formed on the silicon nitride film 42, after which the silicon nitride film 42 is etched with this photoresist film used as a mask according to anisotropic etching technology, for example, reactive ion etching (RIE) so as to pattern the silicon nitride film 42. Further, with the patterned silicon nitride film 42 used as a mask, the p-type well 11 is etched by the RIE so as to form a plurality of grooves (isolation trenches for STI) 43. After that, the photoresist film is removed.

As shown in FIGS. 9A to 9C, subsequently, a silicon oxide film 44 is deposited on the entire surface as an insulation film for isolation, after which the silicon oxide film is polished until the surface of the silicon nitride film 42 is exposed according to the chemical mechanical polishing (CMP) method. As shown in FIGS. 10A to 10C, the interior of the trenches 43 are filled with the silicon oxide film 44 so as to form isolation regions (STI) 45.

Figure 11A:
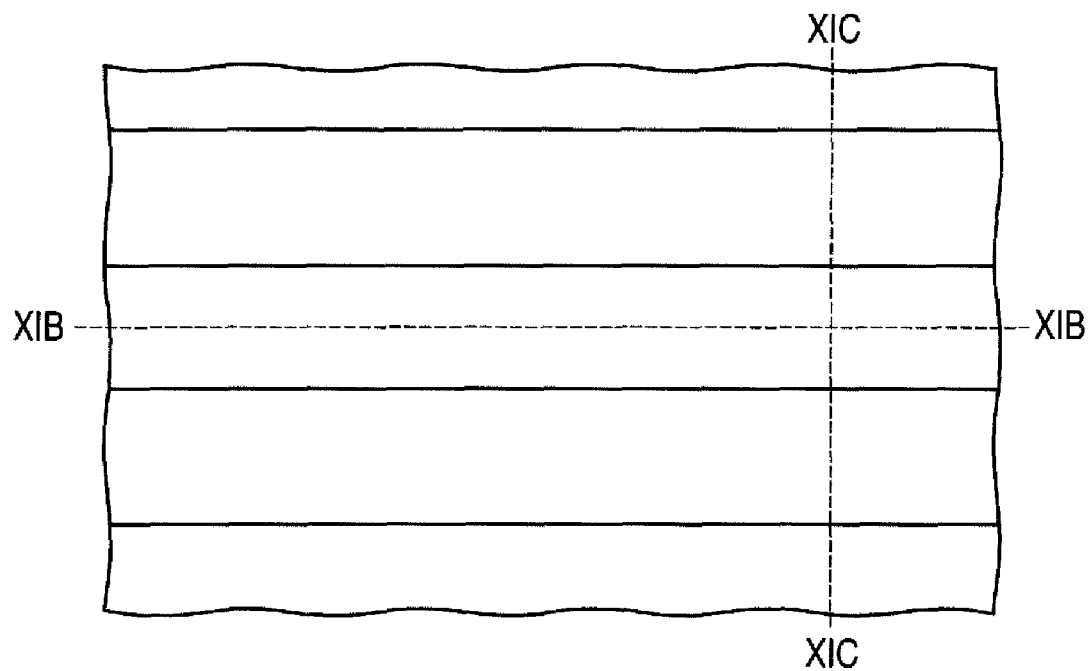
FIGS. 11A to 11C are a plan view and sectional views showing a process subsequent to FIGS. 10A to 10C.
Figure 11B:
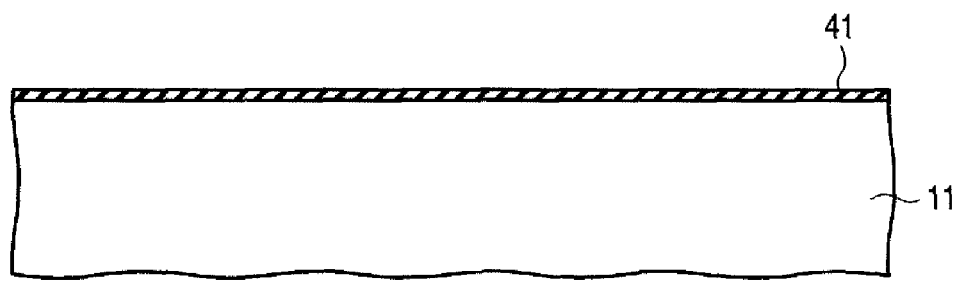
Figure 11C:
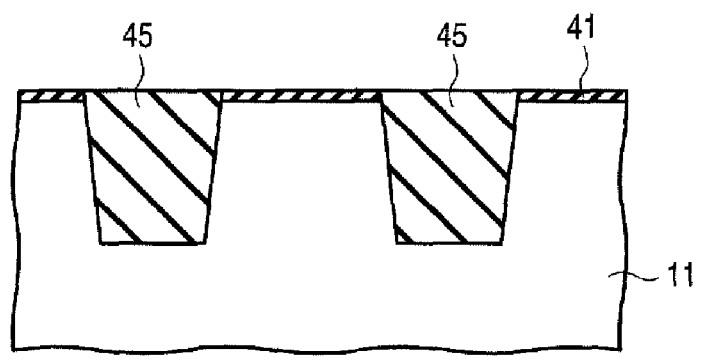

As shown in FIGS. 11A to 11C, subsequently, the silicon nitride film 42 is removed and channel implantation is carried out so that each transistor formed in a subsequent process turns to a desired threshold. After that, the silicon oxide film 41 is removed. As shown in FIGS. 12A to 12C, the silicon oxide film 14 is formed on the entire surface according to the thermal oxidation method and further, a first polysilicon film 46 is deposited according to the chemical vapor deposition (CVD) method. By insitu-doping impurity such as phosphorus (P) when the polysilicon film 46 is deposited, the sheet resistance of the polysilicon is reduced to 100 to 200Ω/□ thereby the parasitic resistance being reduced.

Figure 13A:
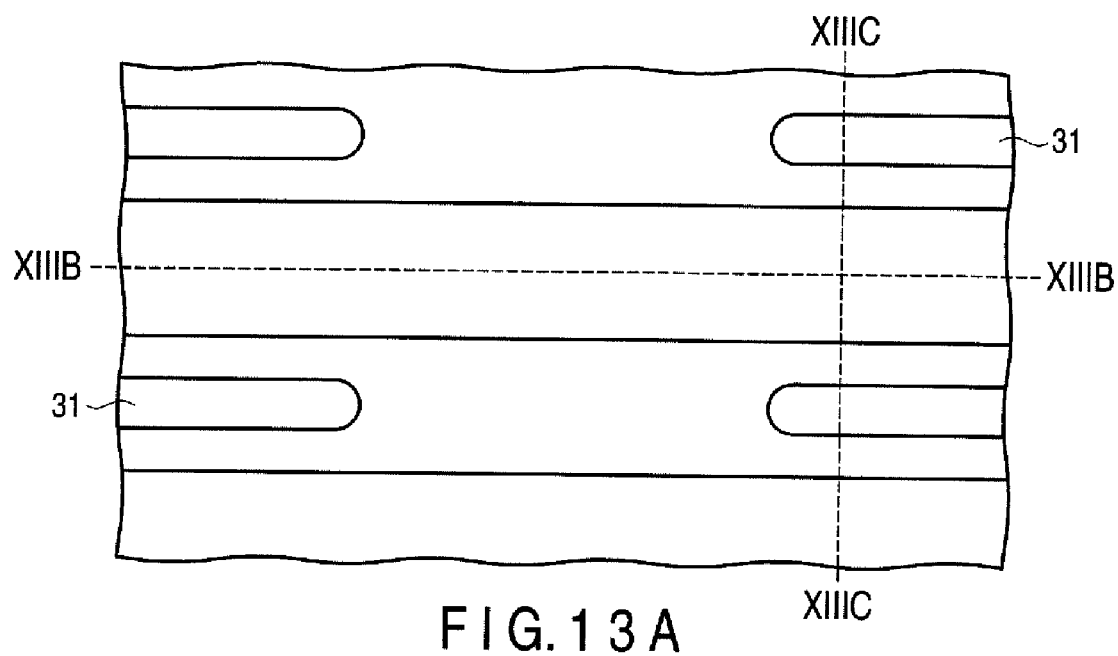
FIGS. 13A to 13C are a plan view and sectional views showing a process subsequent to FIGS. 12A to 12C.
Figure 13B:
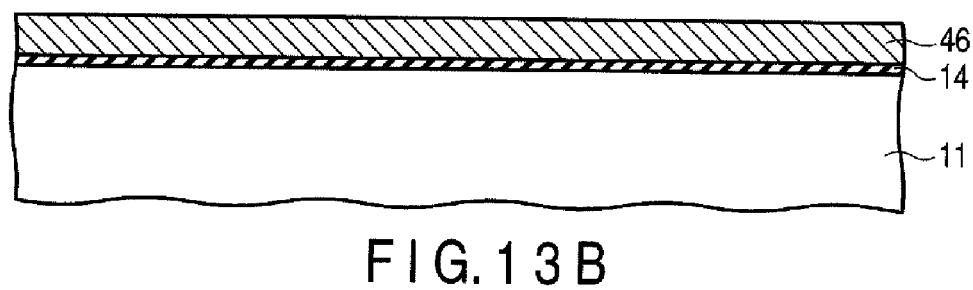
Figure 13C:
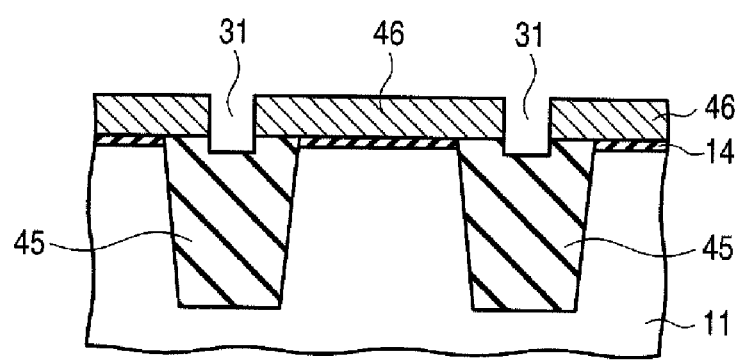

As shown in FIGS. 13A to 13C, after a photoresist film having a desired pattern is formed on the polysilicon film 46, the polysilicon film 46 is etched according to the anisotropic etching technology with this photoresist film used as a mask, so as to form a plurality of slits 31. After that, the photoresist film is removed and as shown in FIGS. 14A to 14C, the inter-gate insulation film 16 composed of ONO film is deposited on the entire surface.

Figure 15A:
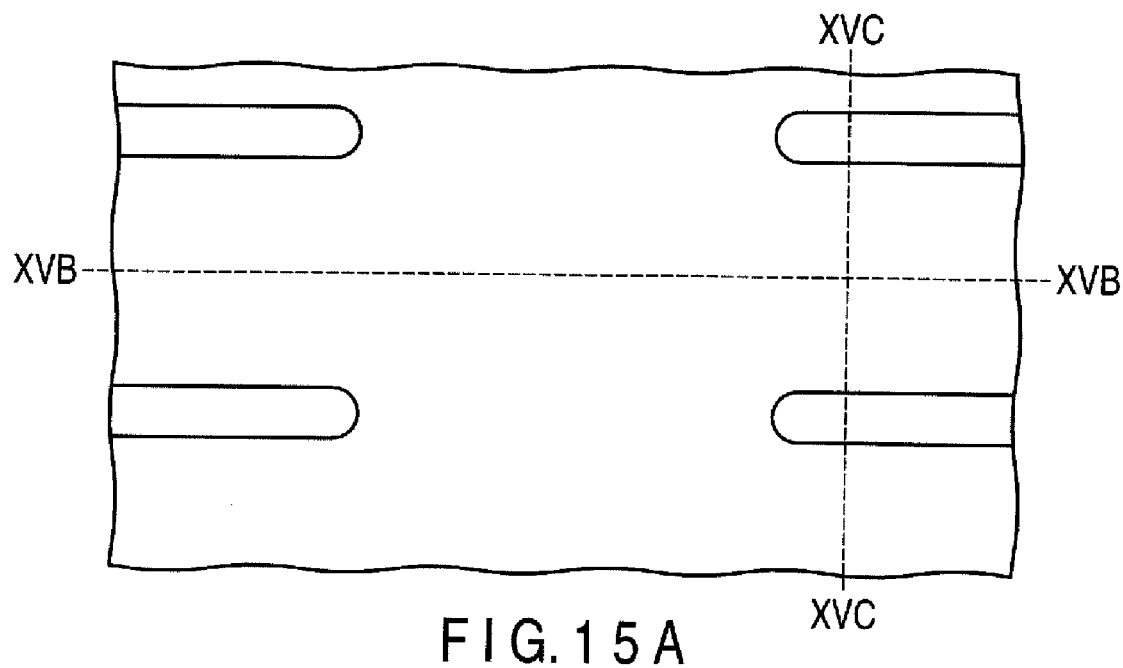
FIGS. 15A to 15C are a plan view and sectional views showing a process subsequent to FIGS. 14A to 14C.
Figure 15B:
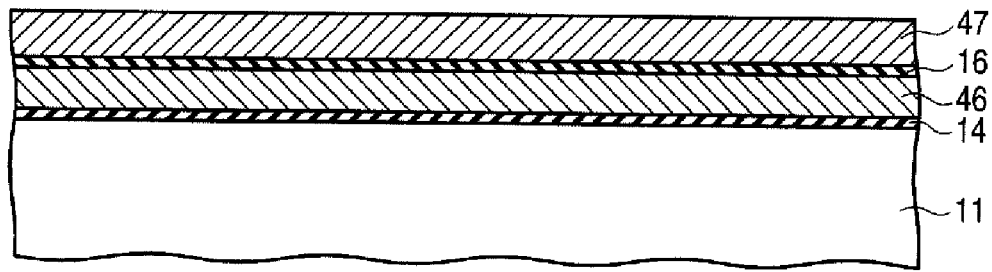
Figure 15C:
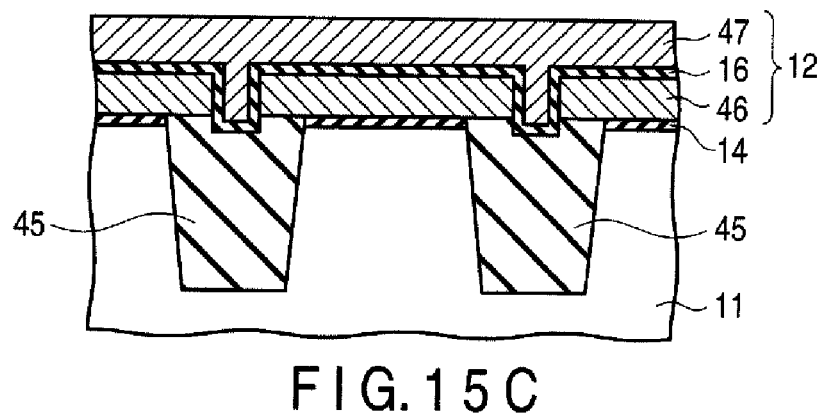

Subsequently, as shown in FIGS. 15A to 15C, a second polysilicon film 47 is deposited on the entire surface according to the CVD method. By insitu-doping impurity such as phosphorus (P) when this polysilicon film 47 is deposited, the sheet resistance is reduced.

Figure 16A:
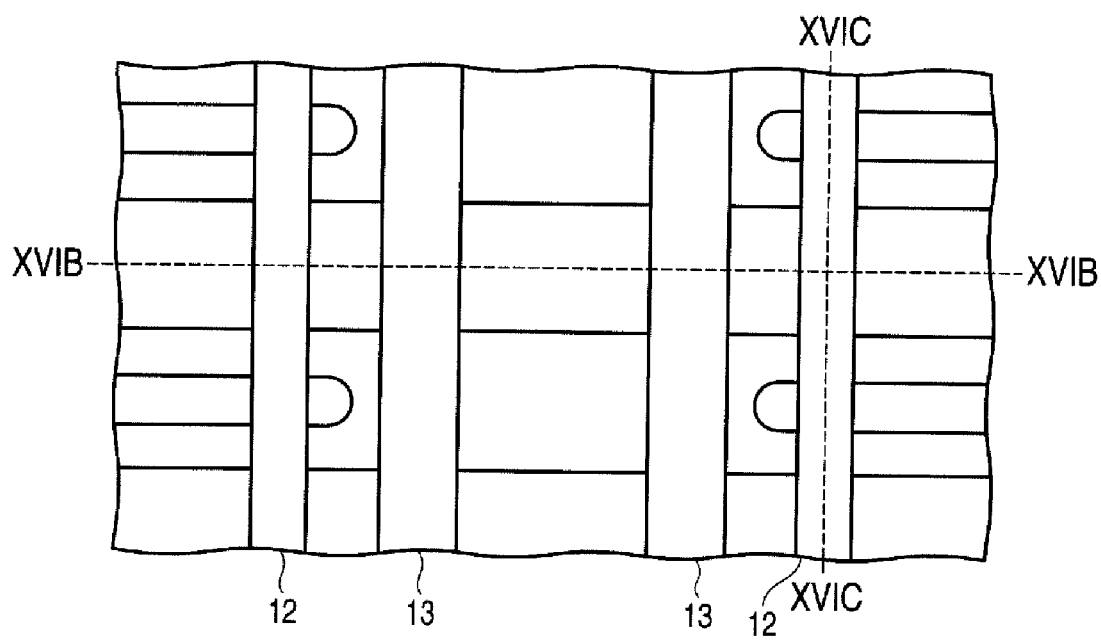
FIGS. 16A to 16C are a plan view and sectional views showing a process subsequent to FIGS. 15A to 15C.
Figure 16B:
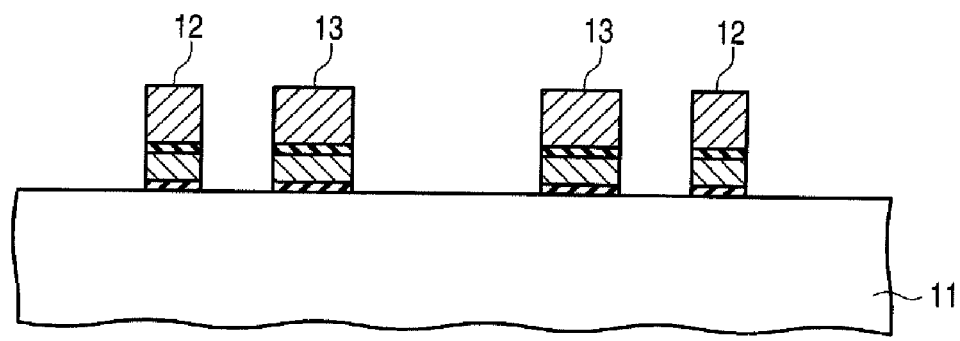
Figure 16C:
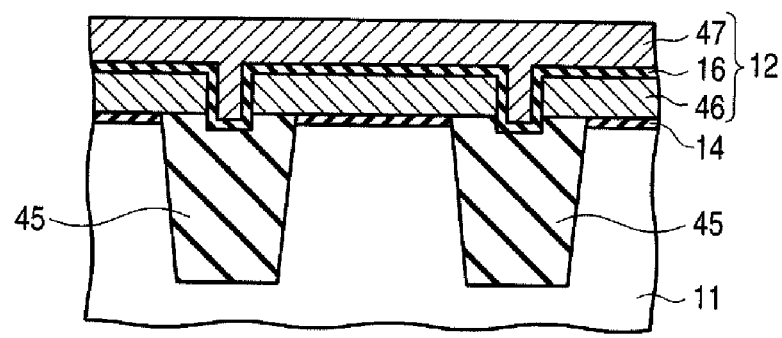

After that, a photoresist film having a desired pattern is formed on the polysilicon film 47 and with this photoresist film used as a mask, the polysilicon film 47, the inter-gate insulation film 16, the polysilicon film 46 and the silicon oxide film 14 are etched successively according to the anisotropic etching technology. As shown in FIGS. 16A to 16C, the gate electrode 12 of the memory cell transistor CT and the gate electrode 13 of the select transistor ST are patterned. At this time, a distance between the gate electrode 12 of the memory cell transistor CT and the gate electrode 13 of the select transistor ST is set shorter than a distance between the gate electrodes 12 of the memory cell transistor CT and a distance between the gate electrodes 13 of the select transistor ST. After the gate electrodes are processed, oxidation to an extent similar to the thickness of a tunnel oxide film is carried out in order to ensure reliability of the oxide film on the gate electrode end.

Figure 22:
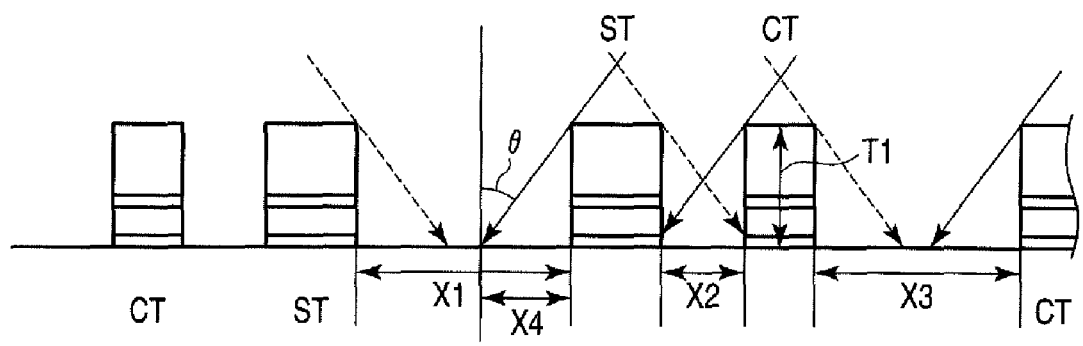
FIG. 22 is a sectional view for explaining the ion implantation process shown in FIGS. 17A to 17C.
Figure 23A:
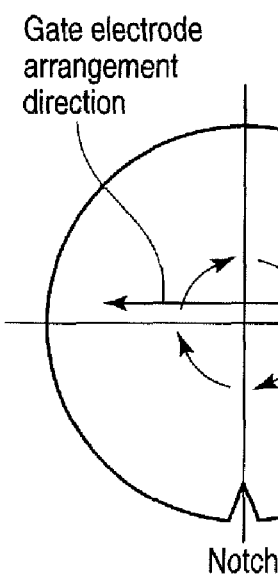
FIG. 23A is a plan view for explaining the ion implantation process shown in FIGS. 17A to 17C and FIG. 23B is a sectional view thereof.
Figure 23B:
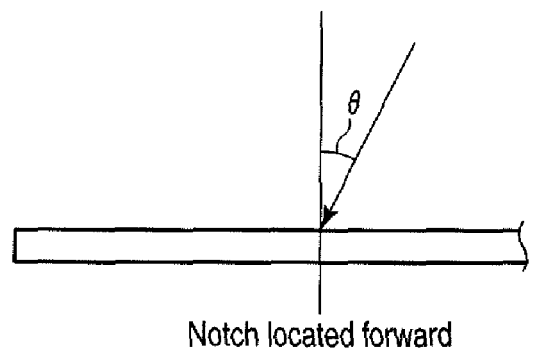

Subsequently, ion implantation for forming the source/drain diffusion layers of each transistor is carried out. The ion implantation process is executed as follows. With a substrate inclined by θ with respect to a vertical direction as shown in FIG. 22, for example, arsenic ion is injected as the n-type impurity with the gate electrode 12 of the memory cell transistor CT and the gate electrode 13 of the select transistor ST used as a mask. As shown in FIGS. 23A and 23B, first, the ion implantation is executed by a dose amount of 5E13 cm$^{-2}$ in a direction parallel to the gate length direction of the gate electrodes 12 and 13, with a direction parallel to the direction of the arrangement of the gate electrodes 12 and 13 as a starting point. Next, the wafer is rotated by 90° about the center thereof and then stopped each time. The ion implantation is carried out by a dose amount of 5E13 cm$^{-2}$ each time in a vertical direction to the gate length direction of the gate electrodes 12 and 13 or in a direction parallel to the gate length direction of the gate electrodes 12 and 13, thereby totally the ion implantation being carried out four times. When as shown in FIG. 22, it is assumed that a distance between the gate electrodes of the select transistor ST is X1, a distance between the gate electrode of the memory cell transistor CT and the gate electrode of the select transistor ST is X2, a distance between the gate electrodes of the memory cell transistor CT is X3, a distance which is half the distance X1 is X4 and the height of the gate electrode is T1, T1, θ, and X2 are set to satisfy the following relationship:

$$X4 = T1 \cdot \tan(90 - \theta) \geq X2 \tag{1}$$

For example, if the thickness of the silicon oxide film 14 which turns to a tunnel oxide film is 10 nm, the thickness of the first polysilicon film 46 is 60 nm, the thickness of the inter-gate insulation film 16 is 18 nm, the thickness of the second polysilicon film 47 is 200 nm while T1=288 nm and θ=30°, when X4=166 nm and X2=150 nm, a surface region of the substrate between the gate electrode of the memory cell transistor CT and the gate electrode of the select transistor ST is subjected to only two time ion implantations of the totally four time ion implantations. Contrary to this, a surface region of the substrate between the gate electrodes of the memory cell transistor CT and a surface region of the substrate between the gate electrodes of the select transistor ST are subjected to the four time ion implantations.

That is, with the gate electrode of the memory cell transistor CT and the gate electrode of the select transistor ST used as a mask, arsenic ion is introduced from a tilted direction with respect to the surface of the substrate. Then, the substrate is rotated by a desired angle horizontally and stopped and arsenic ion is introduced from the tilted direction with respect to the surface of the substrate. The introduction of arsenic ion is repeated plural times.

Figure 17A:
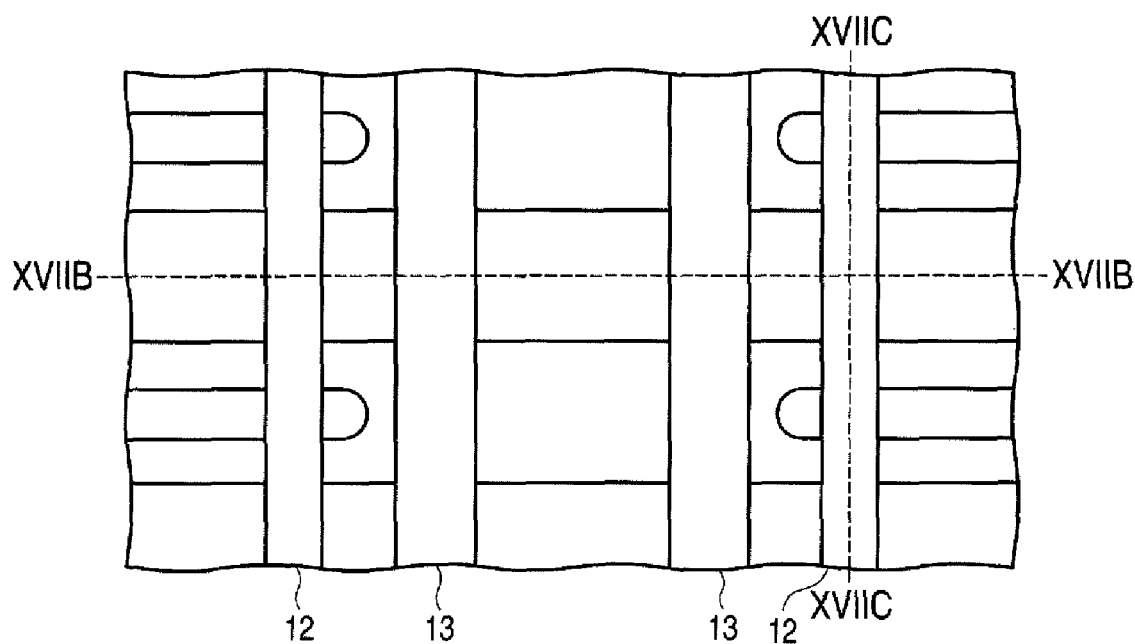
FIGS. 17A to 17C are a plan view and sectional views showing a process subsequent to FIGS. 16A to 16C.
Figure 17B:
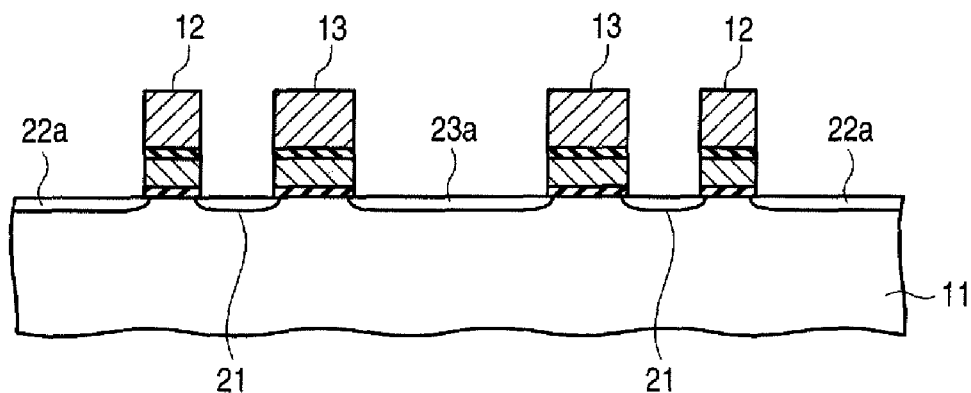
Figure 17C:
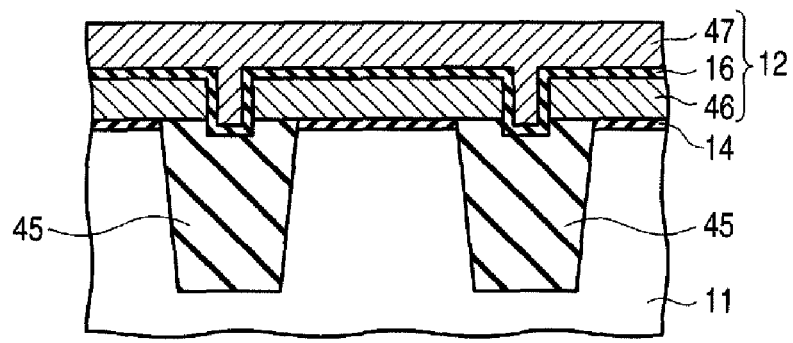

After that, annealing is carried out and consequently, as shown in FIGS. 17A to 17C, the n-type source/drain diffusion layer 21 having an As impurity concentration of 5E18 cm$^{-3}$ is formed in the surface region of the p-type well 11 between the gate electrode 12 of the memory cell transistor CT and the gate electrode 13 of the select transistor ST. The n-type first layer 22a of the source/drain diffusion layer 22 having an As impurity concentration of 2E19 cm$^{-3}$ is formed in the surface region of the p-type well 11 between the gate electrodes 12 of the memory cell transistor CT. Further, the n-type first layer 23a of the source/drain diffusion layer 23 having an As impurity concentration of 2E19 cm$^{-3}$ is formed in the surface region of the p-type well 11 between the gate electrodes 13 of the select transistor ST.

Figure 18A:
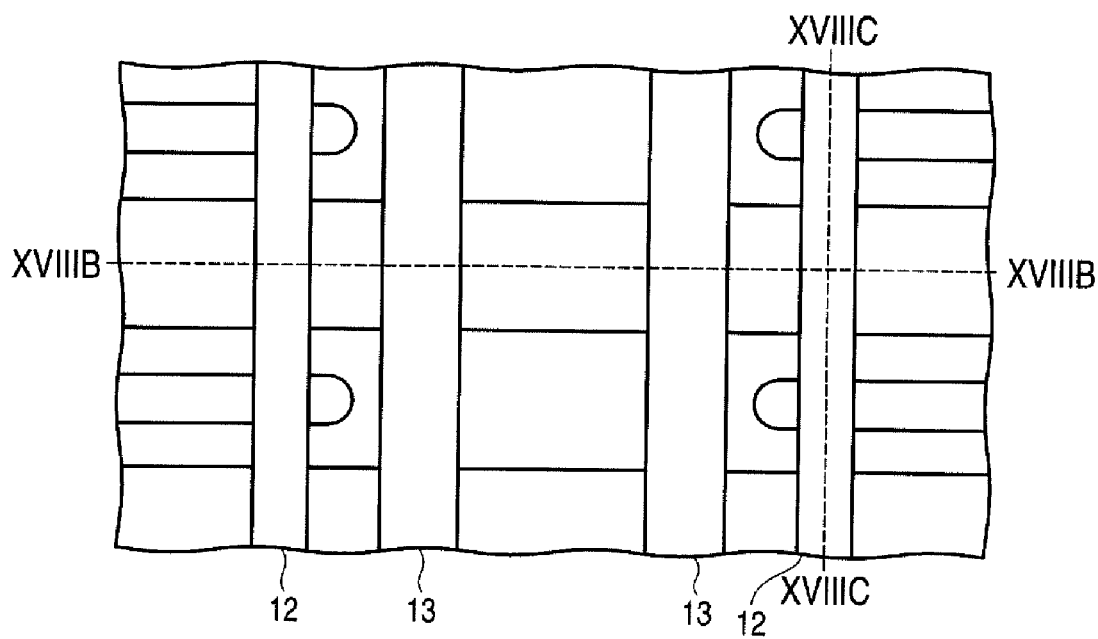
FIGS. 18A to 18C are a plan view and sectional views showing a process subsequent to FIGS. 17A to 17C.
Figure 18B:
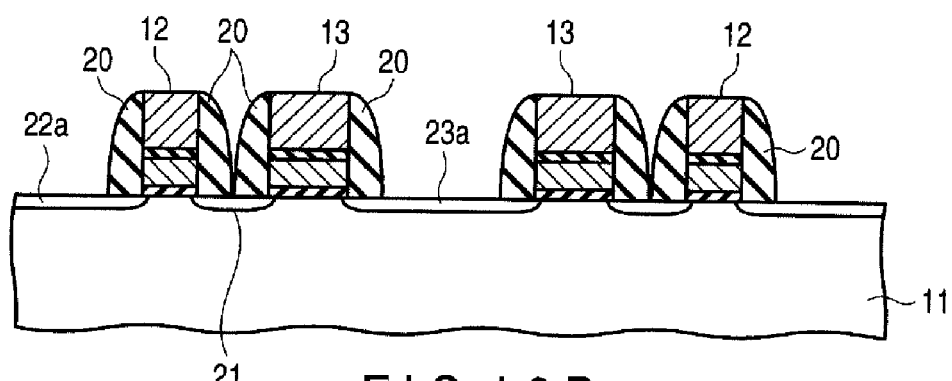
Figure 18C:
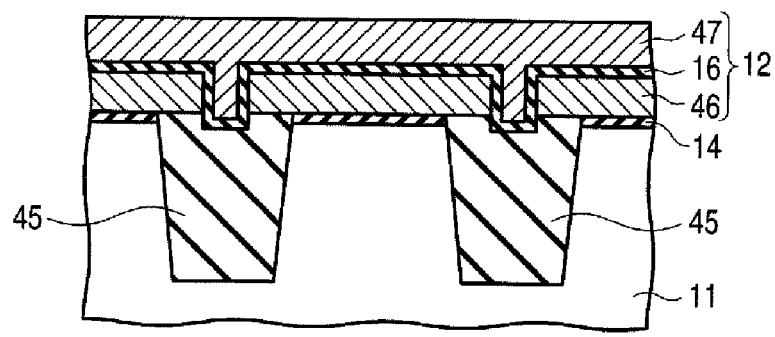

Next, after a silicon nitride film or the like is deposited on the entire surface according to the CVD method, for example, the silicon nitride film is subjected to anisotropic etching by the RIE, so that as shown in FIGS. 18A to 18C, the side wall spacers 20 are formed on the side faces of the gate electrodes 12 and 13.

Figure 19A:
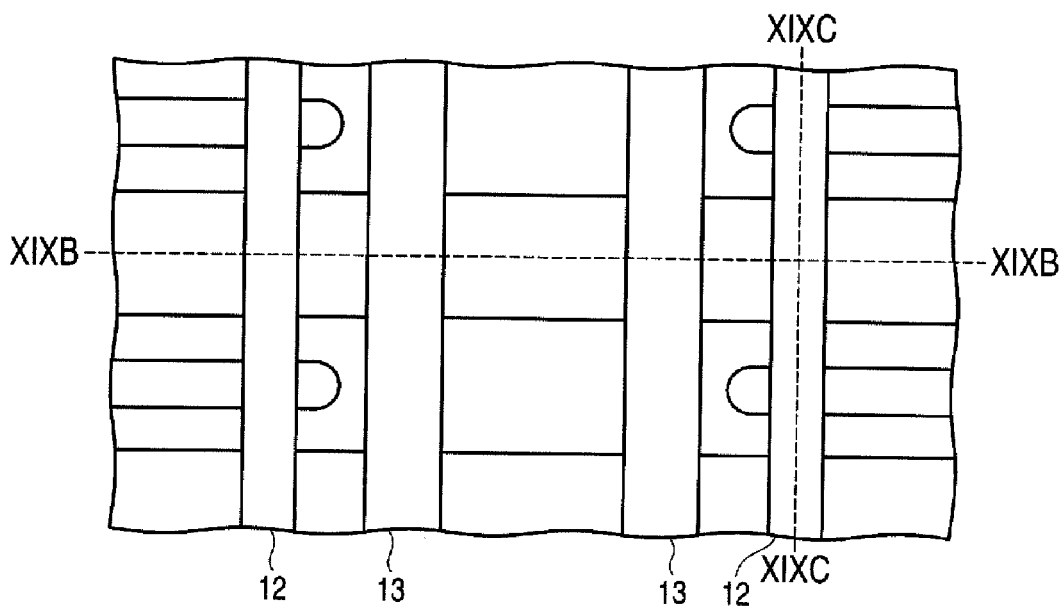
FIGS. 19A to 19C are a plan view and sectional views showing a process subsequent to FIGS. 18A to 18C.
Figure 19B:
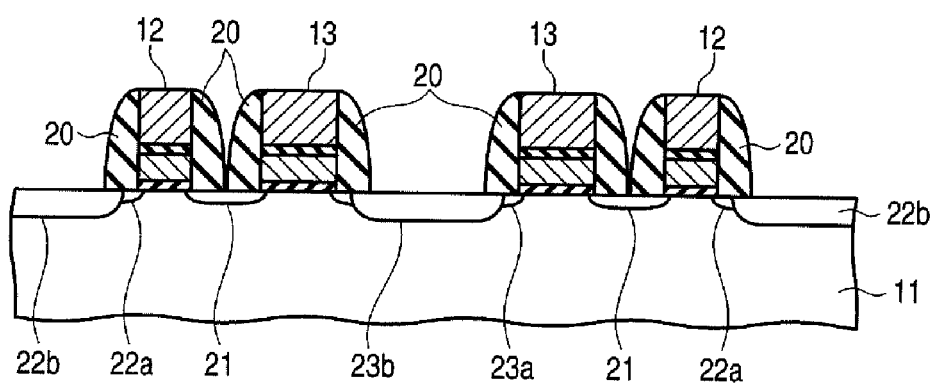
Figure 19C:
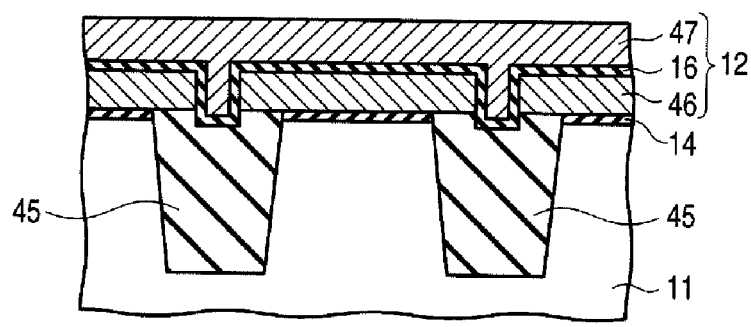

Subsequently, as shown in FIGS. 19A to 19C, for example, arsenic ion is injected as the n-type impurity to a surface region of the substrate in a vertical direction, so that the n+ type second layer 22b is formed as a contact region in the surface region of the p-type well 11 between the gate electrodes 12 of the memory cell transistor CT. At the same time, the n+ type second layer 23b is formed as a contact region in the surface region of the p-type well 11 between the gate electrodes 13 of the select transistor ST. At this time, arsenic ion is blocked by the side wall spacer 20 between the gate electrode 12 of the memory cell transistor CT and the gate electrode 13 of the select transistor ST, thereby not carrying out the ion implantation.

Figure 20A:
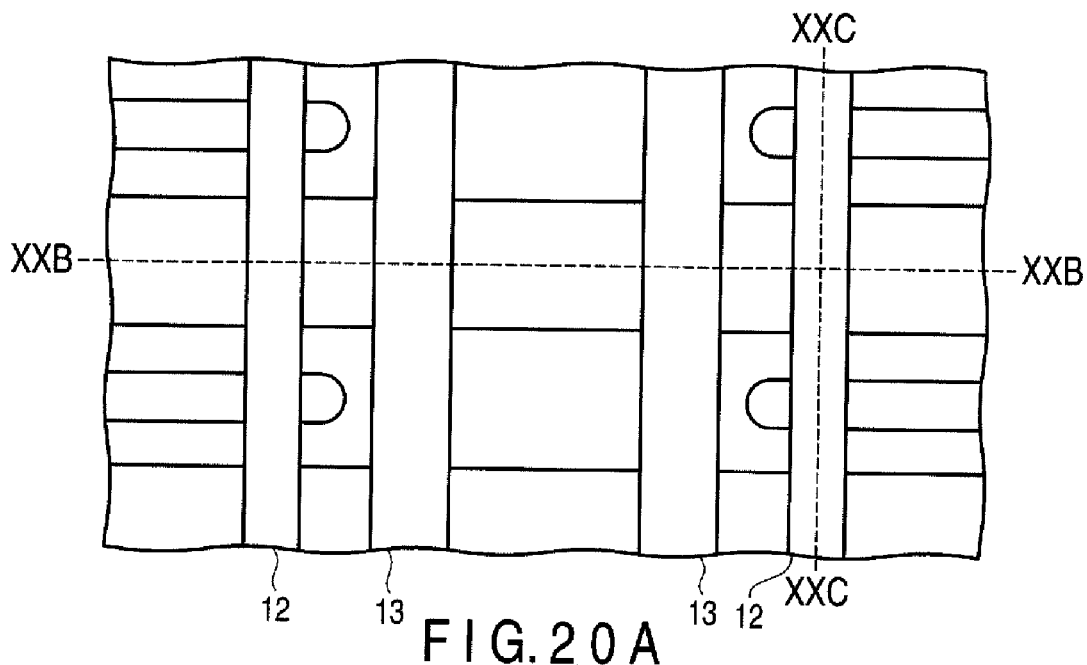
FIGS. 20A to 20C are a plan view and sectional views showing a process subsequent to FIGS. 19A to 19C.
Figure 20B:
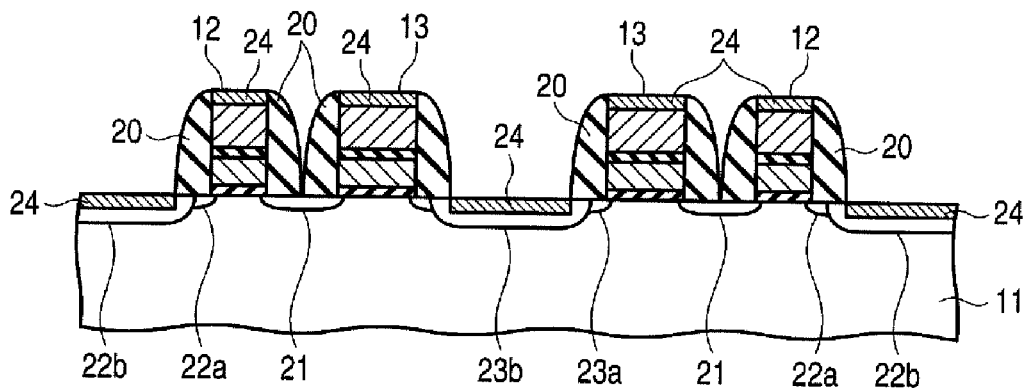
Figure 20C:
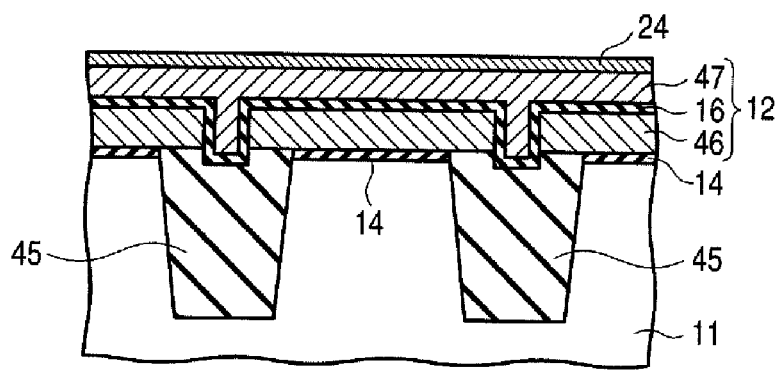

Next, a metal film, for example, cobalt (Co) is deposited on the entire surface, for example, according to the sputtering method so as to anneal the substrate. As a result, silicide reaction is generated between the silicon and cobalt (Co) and after that, unreacted cobalt is removed. After that, second annealing is carried out, so that as shown in FIGS. 20A to 20C, the metal silicide 24 is formed on the surfaces of the source/drain diffusion layers 22, 23 and the surfaces of the gate electrodes 12, 13.

Figure 21A:
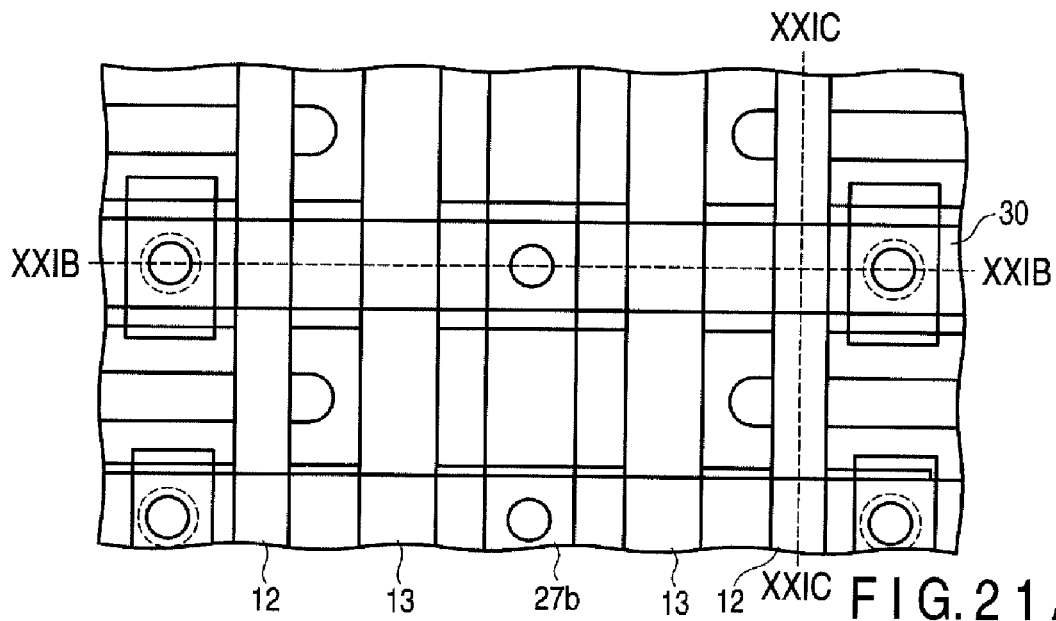
FIGS. 21A to 21C are a plan view and sectional views showing a process subsequent to FIGS. 20A to 20C.
Figure 21B:
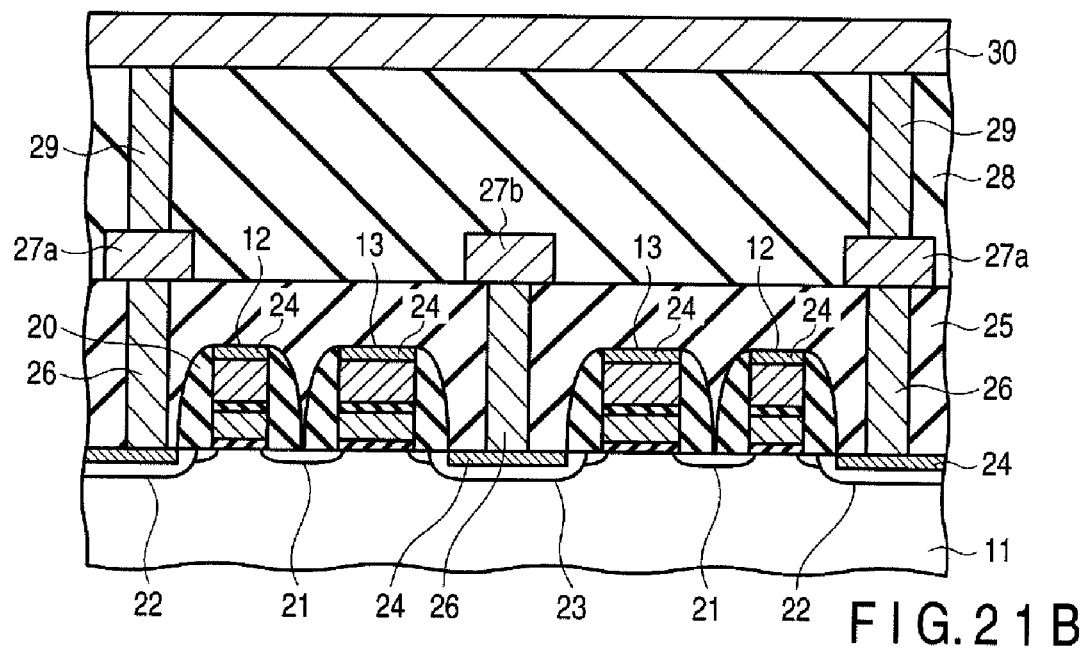
Figure 21C:
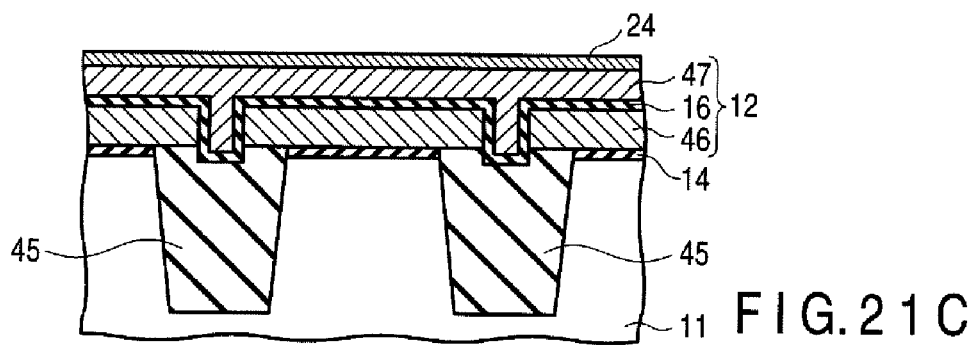

After that, as shown in FIGS. 21A to 21C, the first interlayer insulation film 25 is deposited, contact holes are made to communicate with the surfaces of the source/drain diffusion layers 22 and 23, tungsten (W) is deposited according to the CVD method and the tungsten (W) is polished according to the CMP so as to form the contact plug 26. Further, an aluminum (Al) wiring film is deposited by the sputtering method and after that, the aluminum wiring film is patterned by photolithography so as to form wirings 27a, 27b. The second interlayer insulation film 28 is deposited, via holes are made, tungsten (W) is deposited and the tungsten (W) is polished according to the CMP so as to form the via holes 29. The aluminum (Al) wiring film is deposited according to the sputtering method and the aluminum wiring film is patterned by photolithography so as to form the wiring 30.

After that, the PSG is deposited to protect the wiring aluminum (Al) and the silicon nitride film is deposited according to the plasma enhanced chemical vapor deposition (PE-CVD) and finally, the protection film on a bonding pad is removed.

(Second Embodiment of Manufacturing Method)

The manufacturing method of the second embodiment for the flash EEPROM having the memory cell array having the structure shown in FIGS. 2 and 3 will be described.

The manufacturing method of this embodiment is the same as the first embodiment in the process from FIGS. 7A to 7C to FIGS. 16A to 16C. The ion implantation is carried out in order to form the source/drain diffusion layers of each transistor after the process shown in FIGS. 16A to 16C. The ion implantation in this embodiment is carried out as follows.

With the wafer tilted by θ° with respect to a vertical direction as shown in FIG. 22, ion implantation is executed by a dose amount of 7.5E13 cm$^{-2}$ in a direction parallel to the gate length direction of the gate electrodes 12 and 13 with a direction parallel to the direction of the arrangement of the gate electrodes 12 and 13 as a starting point, as shown in FIGS. 23A and 23B. After that, the wafer is rotated by 180° about the center thereof and stopped and then, the ion implantation is carried out twice by a dose amount of 7.5E13 cm$^{-2}$. Further, the wafer is placed horizontally (θ=0°) and the ion implantation is carried out by a dose amount of 5E13 cm$^{-2}$ in the vertical direction to the substrate. In this case, in an ion implantation process with the wafer tilted by θ° with respect to the vertical direction, no ion implantation is carried out to the surface region of the substrate between the gate electrode of the memory cell transistor CT and the gate electrode of the select transistor ST. By annealing after this, the impurity concentration of arsenic (As) in the surface region of the substrate between the gate electrode of the memory cell transistor CT and the gate electrode of the select transistor ST reaches 5E18 cm$^{-3}$ and the impurity concentration of arsenic (As) in the surface region of the substrate between the gate electrodes of the memory cell transistor CT and the surface region of the substrate between the gate electrodes of the select transistor ST reaches 2E19 cm$^{-3}$.

That is, with the gate electrode of the memory cell transistor CT and the gate electrode of the select transistor ST used as a mask, arsenic (As) ion is introduced from a tilted direction with respect to the surface region of the substrate. After the substrate is rotated horizontally by a predetermined angle, it is stopped and arsenic (As) ion is introduced to the surface region of the substrate from the tilted direction. The introduction of arsenic ion is repeated several times (twice in this example) and further, the arsenic ion is introduced in a vertical direction to the surface region of the substrate.

In this case also, as shown in FIGS. 17A to 17C, the impurity concentration of the n-type source/drain diffusion layer 21 is lower than the impurity concentration of the n-type source/drain diffusion layer 22 and the impurity concentration of the n-type source/drain diffusion layer 23.

Because the process after that shown in FIGS. 17A to 17C is the same as the first embodiment, description thereof is omitted.

(Third Embodiment of Manufacturing Method)

The manufacturing method of the third embodiment for the flash EEPROM containing the memory cell array having the structure shown in FIGS. 2 and 3 will be described.

The manufacturing method of this embodiment is the same as the first and second embodiments in the process from FIGS. 7A to 7C to FIGS. 16A to 16C. The ion implantation for forming the source/drain diffusion layers of each transistor is carried out after the process shown in FIGS. 16A to 16C and the ion implantation for this embodiment is carried out as follows.

With the gate electrode of the memory cell transistor CT and the gate electrode of the select transistor ST used as a mask in the same manner as the first and second embodiments, arsenic (As) ion is introduced from a tilted direction to the surface of the substrate. Further, with the surface region of the substrate between the gate electrode of the memory cell transistor CT and the gate electrode of the select transistor ST masked, arsenic (As) ion is introduced in a vertical direction to the surface region of the substrate.

According to the method of this embodiment, the impurity concentration of the surface region of the p-type well 11 between the gate electrode of the memory cell transistor CT and the gate electrode of the select transistor ST is set lower than the impurity concentration of the surface region of the p-type well 11 between the gate electrodes of the memory cell transistor CT and the impurity concentration of the surface region of the p-type well 11 between the gate electrodes of the select transistor ST.

In the meantime, there is no problem if any process of a process for introducing arsenic (As) ion from the tilted direction to the surface region of the substrate and a process for introducing arsenic (As) ion in the vertical direction to the surface region of the substrate between the gate electrode of the memory cell transistor CT and the gate electrode of the select transistor ST masked may come first.

The above-described embodiments contain inventive ideas of various stages and by combining the disclosed plural components appropriately, a variety of embodiments can be extracted. For example, even if some components are erased from all the components indicated in each embodiment, as long as at least one of the problems which should be solved can be solved and at least one of the effects described in this specification can be obtained, the configuration of the embodiment from which those components are erased can be picked up as another embodiment of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor memory device, comprising:
   forming a plurality of arrays each constituted of a gate electrode of a memory cell transistor having a laminated structure composed of a charge storage layer and a control gate layer and a gate electrode of a select transistor in and on a semiconductor substrate of a first conductivity type such that a distance between the gate electrode of the memory cell transistor and the gate electrode of the select transistor is set shorter than a distance between the gate electrodes of different memory cell transistors and a distance between the gate electrodes of different select transistors;
   simultaneously introducing an impurity of a second conductivity type in a surface region of the semiconductor substrate between the gate electrode of the memory cell transistor and the gate electrode of the select transistor, a surface region of the semiconductor substrate between the gate electrodes of the memory cell transistors and a surface region of the semiconductor substrate between the gate electrodes of the select transistors with the gate electrode of the memory cell transistor and the gate electrode of the select transistor used as a mask;
   the introducing the impurity having a first introduction and a second introduction,
   the first introduction being introducing of the impurity of the second conductivity type in a first direction tilted with respect to the surface region of the semiconductor substrate and having a component parallel to a gate length direction of the memory cell transistor and the select transistor, and
   the second introduction being introducing of the impurity of the second conductivity type in a second direction tilted with respect to the surface region of the semiconductor substrate and having a component perpendicular to the gate length direction of the memory cell transistor and the select transistor; and
   annealing to form source/drain diffusion layers of the memory cell transistor and the select transistor such that an impurity concentration in the surface region of the semiconductor substrate between the gate electrode of the memory cell transistor and the gate electrode of the select transistor is lower than an impurity concentration in the surface region of the semiconductor substrate between the gate electrodes of the memory cell transistors and an impurity concentration in the surface region of the semiconductor substrate between the gate electrodes of the select transistors.

2. The method of manufacturing a semiconductor memory device according to claim 1, wherein the introduction of the impurity of the second conductivity type is executed by ion implantation of arsenic ion.

3. The method of manufacturing a semiconductor memory device according to claim 1, wherein the semiconductor substrate at the time of the first introduction and the semiconductor substrate at the time of the second introduction have mutually the relation rotated 90° horizontally.

4. The method of manufacturing a semiconductor memory device according to claim 3, wherein the first introduction and the second introduction are repeated by turns and the introducing the impurity is performed a total of four times.

5. The method of manufacturing a semiconductor memory device according to claim 1, wherein when the source/drain diffusion layers are formed, the source/drain diffusion layer shared by the memory cell transistor and the select transistor and having the impurity concentration in a range of $1E18$ $cm^{-3}$ to $1E19$ $cm^{-3}$ is formed between the gate electrode of the memory cell transistor and the gate electrode of the select transistor while the source/drain diffusion layer having the impurity concentration of $2E19$ $cm^{-3}$ or more is formed in the other area.

6. The method of manufacturing a semiconductor memory device according to claim 2, wherein the source/drain diffusion layer shared by the memory cell transistor and the select transistor is formed having the impurity concentration of $5E18$ $cm^{-3}$.

7. A method of manufacturing a semiconductor memory device, comprising:
   forming a plurality of arrays each constituted of a gate electrode of a memory cell transistor having a laminated structure composed of a charge storage layer and a control gate layer and a gate electrode of a select transistor in and on a semiconductor substrate of a first conductivity type such that a distance between the gate electrode of the memory cell transistor and the gate electrode of the select transistor is set shorter than a distance between the gate electrodes of different memory cell transistors and a distance between the gate electrodes of different select transistors;

simultaneously introducing an impurity of a second conductivity type in a surface region of the semiconductor substrate between the gate electrode of the memory cell transistor and the gate electrode of the select transistor, a surface region of the semiconductor substrate between the gate electrodes of the memory cell transistors and a surface region of the semiconductor substrate between the gate electrodes of the select transistors with the gate electrode of the memory cell transistor and the gate electrode of the select transistor used as a mask;

the introducing the impurity having a first introduction and a second introduction, the first introduction being introducing the impurity of the second conductivity type in a direction tilted with respect to the surface region of the semiconductor substrate and having a component parallel to the gate length direction of the memory cell transistor and the select transistor, and the second introduction being introducing the impurity of the second conductivity type in a vertical direction with respect to the surface region of the semiconductor substrate; and annealing to form the source/drain diffusion layers of the memory cell transistor and the select transistor such that an impurity concentration in the surface region of the semiconductor substrate between the gate electrode of the memory cell transistor and the gate electrode of the select transistor is lower than an impurity concentration in the surface region of the semiconductor substrate between the gate electrodes of different memory cell transistors and an impurity concentration in the surface region of the semiconductor substrate between the gate electrodes of different select transistors.

8. The method of manufacturing a semiconductor memory device according to claim 7, wherein the introduction of the impurity of the second conductivity type is carried out by ion implantation of arsenic ion.

9. The method of manufacturing a semiconductor memory device according to claim 7, wherein the first introduction has a third introduction and a fourth introduction, the third introduction is introducing an impurity of the second conductivity type in a direction tilted with respect to the surface region of the semiconductor substrate and having a component parallel to the gate length direction of the memory cell transistor and the select transistor, and the fourth introduction is introducing the impurity of the second conductivity type in the direction tilted with respect to the surface region of the semiconductor substrate rotated by 180 ° horizontally and having a component parallel to the gate length direction of the memory cell transistor and the select transistor.

10. The method of manufacturing a semiconductor memory device according to claim 7, wherein when the source/drain diffusion layers are formed, the source/drain diffusion layer shared by the memory cell transistor and the select transistor and having an impurity concentration in a range of $1E18$ $cm^{-3}$ to $1E19$ $cm^{-3}$ is formed between the gate electrode of the memory cell transistor and the gate electrode of the select transistor while the source/drain diffusion layer having an impurity concentration of $2E19$ $cm^{-3}$ or more is formed in the other area.

11. The method of manufacturing a semiconductor memory device according to claim 10, wherein the source/drain diffusion layer shared by the memory cell transistor and the select transistor is formed having the impurity concentration of $3E19$ $cm^{-3}$.

12. The method of manufacturing a semiconductor memory device according to claim 1, wherein when the impurity of the second conductivity type is introduced in the direction tilted with respect to the surface region of the semiconductor substrate, the impurity is introduced with a substrate inclined by θ with respect to a vertical direction, a distance between the gate electrodes of the select transistor is X1, a distance between the gate electrode of the memory cell transistor and the gate electrode of the select transistor is X2, a distance which is half the distance X1 is X4 and the height of the gate electrodes of the memory cell transistor and the select transistor is T1, T1, θ, and X2 are set to satisfy the following relationship: $X4=T1 \cdot \tan(90-\theta) \geq X2$.

13. The method of manufacturing a semiconductor memory device according to claim 7, wherein when the impurity of the second conductivity type is introduced in the direction tilted with respect to the surface region of the semiconductor substrate, the impurity is introduced with a substrate inclined by θ with respect to a vertical direction, a distance between the gate electrodes of the select transistor is X1, a distance between the gate electrode of the memory cell transistor and the gate electrode of the select transistor is X2, a distance which is half the distance X1 is X4 and the height of the gate electrodes of the memory cell transistor and the select transistor is T1, T1, θ, and X2 are set to satisfy the following relationship: $X4=T1 \cdot \tan(90-\theta) \geq X2$.

* * * * *